(12) United States Patent
Kowalczewski et al.

(10) Patent No.: US 11,490,526 B2
(45) Date of Patent: Nov. 1, 2022

(54) METHOD OF FORMING A STRUCTURE UPON A SUBSTRATE

(71) Applicant: XTPL S.A., Wroclaw (PL)

(72) Inventors: Piotr Kowalczewski, Wroclaw (PL); Aneta Wiatrowska, Wroclaw (PL); Michal Dusza, Wroclaw (PL); Filip Granek, Tanskiego (PL)

(73) Assignee: XTPL S.A., Wroclaw (PL)

( * ) Notice: Subject to any disclaimer, the term of this patent is extended or adjusted under 35 U.S.C. 154(b) by 0 days.

(21) Appl. No.: 17/265,382

(22) PCT Filed: Aug. 1, 2019

(86) PCT No.: PCT/EP2019/070816
§ 371 (c)(1),
(2) Date: Feb. 2, 2021

(87) PCT Pub. No.: WO2020/025767
PCT Pub. Date: Feb. 6, 2020

(65) Prior Publication Data
US 2021/0307176 A1    Sep. 30, 2021

(30) Foreign Application Priority Data
Aug. 3, 2018 (GB) .................................. 1812691

(51) Int. Cl.
*H05K 3/00* (2006.01)
*H05K 3/12* (2006.01)
(Continued)

(52) U.S. Cl.
CPC .......... *H05K 3/1241* (2013.01); *H05K 3/105* (2013.01); *H05K 1/097* (2013.01); *H05K 2201/0373* (2013.01); *H05K 2203/105* (2013.01)

(58) Field of Classification Search
CPC .................................. H05K 3/00; H01L 23/00
See application file for complete search history.

(56) References Cited

U.S. PATENT DOCUMENTS

2004/0246650 A1* 12/2004 Grigorov ................ H01L 35/32
257/E23.114
2009/0014821 A1* 1/2009 Mattila ............... B81C 1/00031
438/57

OTHER PUBLICATIONS

"AC electric field induced dielectrophoretic assembly behavior of gold nanoparticles in a wide frequency range", Applied Surface Science, vol. 370, May 1, , pp. 184-192 (Year: 2016).*

* cited by examiner

*Primary Examiner* — David P Turocy
*Assistant Examiner* — Mohammad Mayy
(74) *Attorney, Agent, or Firm* — Taft Stettinius & Hollister LLP; Ryan O. White; Derek B. Lavender

(57) ABSTRACT

A method of forming a structure upon a substrate is disclosed. The method comprises: providing a substrate upon a surface of which a plurality of electrically conductive pads are disposed; depositing fluid containing a dispersion of electrically polarizable nanoparticles onto the substrate such that at least a portion of a first one of the plurality of pads is in contact with the fluid; applying an alternating electric field to the fluid using a first electrode and a second electrode, the first electrode being positioned so as to provide an effective first electrode end position from which the electric field is applied, coincident with the deposited fluid, and spaced apart from the first pad by a distance, and the second electrode being in contact with the first pad, such that a plurality of the nanoparticles are assembled to form a first elongate structure extending along at least part of the distance between the effective first electrode end position and the portion of the first pad.

19 Claims, 10 Drawing Sheets

(51) Int. Cl.
*H05K 3/10* (2006.01)
*H05K 1/09* (2006.01)

METHOD OF FORMING A STRUCTURE UPON A SUBSTRATE

This application is a U.S. National Phase of PCT/EP2019/070816 filed on Aug. 1, 2019, the contents of which being incorporated herein by reference in entirety.

FIELD OF THE INVENTION

The present invention relates to a method of forming a structure upon a substrate, to an assembly comprising a substrate having one or more electrically conductive pads disposed on a surface thereof and one or more elongate structures formed on a surface thereof, and to an apparatus for forming a structure upon a substrate.

BACKGROUND TO THE INVENTION

It is beneficial in a large number of industrial applications to provide substrates comprising narrow or high-spatial resolution structures upon their surfaces. In particular, the demand for increasing the miniaturization of electrical circuits requires conductive lines, or elongate structures, to be formed that are both ultra-narrow, with a preferable width less than 1 μm, and densely packed, that is with reduced distances between lines. In addition to these requirements, it is desired in many applications to provide elongate structures that are long, as well as ultra-narrow. For instance, while it is useful in many instances to produce elongate structures with widths of less than 1 μm, or even widths of the order of a few hundred nanometres, it is often advantageous to be able to form such structures with lengths in the order of millimetres, or even centimetres.

A known method of forming elongate structures conforming to these dimensional requirements is disclosed in F. Granek and Z. Rozynek, "Bottom-up method for forming wire structures upon a substrate", WO 2017/162696 A1, 28 Sep. 2017.

The mechanism that underlies the assembly of nanoparticles within a fluid into an elongate structure according to this known approach is dielectrophoresis (DEP) action. In its broadest form, this phenomenon involves the exertion of a force upon a dielectric particle in the presence of a non-uniform electric field. The application of an alternating field, that is an AC field, across a region of fluid containing electrically polarizable particles leads to a dielectrophoretic force being felt by the particles. Dielectrophoresis does not necessarily require an AC field, and DC dielectrophoresis effects may be created using DC fields also, not least since it is the field gradient which gives rise to the particle movement. However, the application of alternating fields may avoid some deleterious effects associated with DC dielectrophoresis, such as the disruption of the assembly process by electrolysis.

Typically, in dielectrophoretic (DEP) particle assembly, the force arises via interaction between the gradient of an inhomogeneous electric field and electric dipoles which are induced in the particles by the alternating field. Thus dielectrophoretic forces are exerted upon the particles, these forces comprising a first component resulting from an attractive electrostatic interaction between the dipoles directed along the direction of the electric field lines, which may result in a chaining effect, and a component arising from the dipole-non-uniform AC field interaction, being directed along the field gradient and typically leading to a concentration of particles being assembled at the end of a growing elongate structure.

A fluid with nanoparticles dispersed within may be thought of as a fluid ink. The application of an electric field to nanoparticles within a deposited drop or line of fluid ink gives rise to nanoparticles agglomerated at the end of an electrode and aggregating directionally so as to cause an elongate structure made of nanoparticles to grow in the direction of the electric field gradient. These elongate structures, which are made from particles having diameters in the order of nanometres, typically have dimensions of the order of 10s, 100s or 1000s of nanometres in height and width, and it is therefore this phenomenon which contributes to the ability of this approach to produce ultra-narrow line structures.

In some applications, the nanoparticles provided in the fluid may comprise an electrically conductive material such as silver or gold. Typically the material of the nanoparticles is selected to have an electrical conductivity during the method greater than $1\times10^6$ Sm$^{-1}$. More preferably the conductivity is greater than $3\times10^7$ Sm$^{-1}$, or more preferably still, greater than $4\times10^7$ Sm$^{-1}$. These are preferable ranges for the conductivity of the material of the nanoparticles, however, and nanoparticles that are less electrically conductive may also be used. Moreover, these are preferred values of the bulk conductivity of the material of the nanoparticles. The electrical properties of the selected material may be affected by having nanoscale dimensions when formed into a nanoparticle, whereas these typical values of nanoparticle material conductivity apply to the properties of the material as measured at the macroscopic scale. That is, these are typical bulk, or intrinsic conductivity values for the nanoparticle material. In some applications the nanoparticles may comprise a semiconducting material. Many suitable semiconductor materials are known, which may be formed into nanoparticles suitable for use with the method of the invention in cases where a semiconducting elongate structure or pattern is required. The nanoparticles may comprise, for example, one or more of: ZnO, TiO$_2$, CdTe, CdS, copper indium gallium (di)selenide (CIGS), or a combination of core-shell nanoparticles. WO 2017/162696 A1 explains, at the passages from the penultimate paragraph on page 28 to the first paragraph on page 30, how these different materials may be used.

Typically, the fluid used in DEP assembly comprises a solvent, a surfactant, an organic binder, and deagglomerants. The composition of the fluid is selected such that the formed lines are not broken during the drying process. This is effected via altering the surface tension of the fluid by the use of additives in the fluid.

The solvent, which is a principal or main component of the fluid composition, by mass, may be either polar or non-polar, or may be a mix of solvents. The different solvents which may be used may have different boiling temperatures. However, the fluid composition is typically selected such that, while the fluid may be made to readily evaporate during the drying process of the method, the fluid does not evaporate before the entire structure within a wetted region is assembled, as this premature drying would adversely impact the formation process.

Typically, in addition to the solvent component, the fluid may further comprise, similarly to inkjet or screen printing inks, a surfactant and an organic binder, or one of these two. The surfactant has the function of reducing the surface tension of the fluid, even in the case that it exists in very small amounts within the fluid such as a mass fraction of 0.01% to 10%. A typical surfactant may be Triton X-100, which a commercially available surfactant. The organic binder may improve the adhesion of the formed structure to the surface during the drying process and/or a process by which the assembled structure is sintered. An example of a suitable organic binder is glucose. The organic binders present in the fluid function as a glue or adhesive that improves the adhesion of the assembled structure to the substrate. In some embodiments, this process may require increased temperature levels, typically by a range of 50° C. to 500° C., and more preferably between 100° C. and 250° C.

The mass fraction of the nanoparticles within the fluid may typically be in the range 0.01% to 10%. More preferably, the mass fraction of the nanoparticles within the fluid is in the range 0.02% to 5%.

The DEP printing technique further allows elongate nanoparticle structures to be formed having widths of less than 1 micrometre for instance. Widths of 250 nanometres and smaller are achievable using the DEP line forming method.

This approach provides the advantage that, even for relatively wide wetted regions, for example those having widths of 100 micrometres, the DEP printing method allows the formation of ultra-narrow lines less than 1 micrometre in width therein.

It will be understood that dielectrophoretic (DEP) self-assembly as employed by these prior art approaches and also the present invention is an entirely different phenomenon from, and provides advantageous effects not provided by, electrohydrodynamic (EHD) self-assembly. The key difference between DEP and EHD is that, in the former, an external electric field acts on nanoparticles within the fluid, whereas in the case of EHD an external electric field acts upon a fluid. The implementation of each of these methods also differs. EHD printing requires a substrate to be placed between the electrodes applying the electric field, with the top electrode typically positioned a few micrometres above the substrate surface. If the thickness of the substrate is too great, or if the distance between the top electrode and the substrate surface is too great, the voltage required in order to effect the EHD assembly process will typically become prohibitively large. A further limitation of EHD is that this method is only suitable for printing upon flat surfaces, or surfaces having substantially low surface roughness, in order to keep the fixed distance between the top electrode and the substrate at the precisely required level.

A further distinction between DEP techniques and EHD is that, in the former, elongate structures or lines may be printed in a single run, producing structures with a reasonably high "height to width" aspect ratio. On the other hand, EHD techniques operate by building up lines layer by layer, since each layer is approximately the height of a single nanoparticle diameter. This is typically 70-100 nm. Thus the assembly or printing speed is fundamentally limited, as is the scalability of the EHD process, in particular if thicker lines, e.g. of around 500 nm in height are required.

In some DEP printing methods according to the prior art, during the step of applying the alternating electric field, the method involves increasing the separation between first and second electrodes so as to further extend an elongate structure towards the second electrode. In other words, moving one or both of the electrodes so that the distance between them increases causes the elongate structure to grow in length by the addition of extra particles to an end of the structure at an assembly region proximal to the moving electrode.

An advantage of this is seen when the second electrode is moved, while the first electrode remains in its initial position, and when the strength of the applied electric field is adjusted so that the growth rate of the assembly of nanoparticles may remain constant. The aggregation of particles to the growing end of an elongate structure may result in a constant growth rate and structures that are substantially uniform in their cross-sectional size and shape, that is their thickness, height, width or cross-sectional area in a plane perpendicular to the elongate axis, that is the direction of growth. Where a constant or uniform growth rate is maintained, the resulting morphology of a formed structure may also be uniform. It is therefore additionally advantageous to keep the growth rate and electric field conditions uniform over longer distances, in order to achieve more uniform structures.

This known technique therefore provides a way of printing ultra-fine structures on a surface or substrate by moving one of the electrodes around the surface. This method contrasts with nanoparticle assembly techniques in which fixed, that is non-movable, electrodes do not provide the printability afforded by the moving electrode approach. In other words, the ability to move one of the electrodes freely so as to create large or complex patterns formed from elongate structures provides an advantage. With other previous techniques only small structures may be formed by self-assembly, with line lengths typically below 1 millimetre.

DEP line printing employing a moving electrode makes it possible to print elongate nanomaterial with sub-micrometre line widths. This makes it possible to print structures without any particular length or size limit. For example, sub-micrometre lines assembled from nanoparticles may be formed having lengths in the order of several centimetres. The free movement of the electrode during the assembly process allows an advantageous degree of freedom over the size and shape of the printed structures, thereby overcoming the limitation to assembling straight lines only which is seen in prior art assembly techniques.

An example method for forming structures upon a substrate using dielectrophoresis and moving a second electrode is described in WO 2017/162696 A1 at the passages from the final paragraph on page 40 to the penultimate paragraph on page 44.

Although this known technique is able to produce or print ultra-narrow elongate line structures without the length limitations of prior DEP assembly techniques, the problem remains that reliance upon a moving, or "floating", second electrode, to trace out the entire length of an elongate structure so as to precisely guide the assembly end of the structure along the path of formation causes the fabrication process to be slower and more difficult than desired.

What is needed, therefore, is a way of producing structures having these industrially useful ultra-narrow and long geometries, while removing, or at least reducing, the adverse impact of guiding DEP structure assembly using the moving electrode approach upon the efficiency of the fabrication process.

SUMMARY OF THE INVENTION

In accordance with a first aspect of the invention there is provided a method of forming a structure upon a substrate, the method comprising: providing a substrate upon a surface of which a plurality of electrically conductive pads are disposed; depositing fluid containing a dispersion of electrically polarizable nanoparticles onto the substrate such that at least a portion of a first one of the plurality of pads is in contact with the fluid; applying an alternating electric field to the fluid using a first electrode and a second electrode, the first electrode being positioned so as to provide an effective first electrode end position from which the electric field is applied, coincident with the deposited fluid, and spaced apart from the first pad by a distance, and the second electrode being in contact with the first pad, such that a plurality of the nanoparticles are assembled to form a first elongate structure extending along at least part of the distance between the effective first electrode end position and the portion of the first pad, and continuing to apply the electric field to the fluid at least until the first elongate structure connects the first pad and the effective first electrode end position, wherein the method further comprises: depositing fluid containing a dispersion of electrically polarizable nanoparticles onto the substrate such that at least a portion of a further one of the plurality of pads is in contact with the fluid; and applying an alternating electric field to the fluid using the first electrode positioned so as to provide a further effective first electrode end position from which the electric field is applied, coincident with the deposited fluid and spaced apart from the further pad by a distance and a second electrode in contact with the further pad, such that a plurality of the nanoparticles are assembled to form a further elongate structure extending along at least part of the distance between the further effective electrode end position and the portion of the further pad, Whereas prior art techniques for dielectrophoretic structure assembly addressed the problem of obtaining elongate structures that are both long and ultra-narrow by moving an electrode along a path so as to draw the region of structure assembly along with it, the inventors have found an entirely different approach to meeting these dimensional requirements. In contrast to the use of a moving electrode to draw such elongate structures on a substrate, it has been found that providing a substrate upon which electrically conductive pads are disposed can facilitate the fabrication of dielectrophoretically assembled structures having any arbitrary length or geometry in a manner that is faster, easier, and more controllable than the prior art methods. This may be achieved by using pads positioned along a path corresponding to the desired geometry or pattern of a structure to be assembled by dielectrophoresis to guide the formation of elongate structures. In other words, by electrically activating conductive pads disposed on a substrate by way of contacting those pads with electrodes, the pads themselves may be used to control or modulate the electric and dielectrophoretic force fields experienced by nanoparticles in fluid deposited on a substrate. By selecting appropriately positioned conductive pads and using appropriately configured process parameters when applying an alternating electric field to fluid on the substrate, longer lines, such as elongate structures having lengths in the order of centimetres and greater, may be created more easily and quickly than with prior art techniques that require a moving electrode to be precisely controlled to move along the path of a structure to be assembled.

In addition to the facilitation of long ultra-narrow line formation, and the creation of compound structures with arbitrary geometries according to the positioning of the disposed pads, the technique of utilising such pads provides further advantages.

Firstly, growing an elongate structure on a substrate so that the structure contacts pads that are fixed to the substrate may improve the adhesion of the formed structure to the substrate. The physical connection between the formed elongate structure and the disposed pad or pads may serve to affix one or both ends of the structure to the substrate surface via the pad or pads, and thereby may secure the formed structure to the substrate more effectively.

Additionally, growing an elongate structure towards a pad so that the structure extends so as to contact the pad may result in the structure undergoing a lesser degree of mechanical stress than would otherwise be exerted upon it if a prior art, moving/floating electrode technique were to be used. This is because, in such prior art methods, the growing elongate structure can extend so as to reach the moving electrode. This is undesirable as the structure joining to and creating a short circuit with the moving electrode can cause the elongate structure to experience mechanical stress, and this is worsened by greater movements by the moving electrode. This potentially damaging occurrence is avoided when an elongate structure is grown so as to contact an electrically activated conductive pad, since the structure typically grows to reach the pad, which is stationary with respect to the substrate, and does not become joined to or experience damage from attachment to a moving electrode component.

In this disclosure the term pad refers generally to an area to which electrical connections can be made, in accordance with the normal meaning of the term in a field of electronics. The pads are typically formed as substantially flat structures, in accordance with the usual understanding in the field of electronics that a pad is a flat area on a track of a printed circuit or on the edge of an integrated circuit to which wires or component leads can be attached to make an electrical connection. Rather than wires or leads, the method of this disclosure may utilise connecting, conductive elongate structures. These may then be formed so as to make electrical contact with the pads in the form of regions or islands of conductive material disposed on the surface of a substrate, similarly to conventional connection pads. Thus an elongate structure, typically formed of conductive material, can be grown towards or from a pad, and if growth towards a pad is continued the structure may make electrical contact with it.

Typically the pads are electrically conductive in that they are formed from a material that would be recognised in the field of electronics as being an electrical conductor. For example, a pad may be formed from a metal material such as silver, copper, gold, aluminium, iron, steel, brass, platinum, copper, or bronze. Materials with higher degrees of electrical conductivity are preferred. For example, in some embodiments, the electrical conductivity of the material of a pad during the performing of the method is greater than $1 \times 10^6$ Sm$^{-1}$, or more preferably $1 \times 10^7$ Sm$^{-1}$.

The pads may be thought of, in some embodiments, as conductive islands, by virtue of the electrical conductivity of the pads being greater than that of the relatively insulating material of the substrate. Typically, the pads are formed from a material that is more electrically conductive than the fluid. That is, the electrical conductivity of the material of the pads, under typical conditions for forming structures, is typically greater than that of the fluid itself, or than the overall conductivity or net conductivity of the fluid comprising the nanoparticles.

Typically, the pads provide an area or structure disposed upon the substrate surface and able to act as an extension of an electrode that is brought into electrical contact with it. In this way, an electric field applied to the fluid by an electrode may be transmitted, or at least partly transmitted, through a pad with which the electrode is in electrical contact. The electrical contact may be direct, in that the electrode is physically touching the pad itself, or it may be indirect in that the electrode is in indirect contact with the pad via a conductive path or member. Any of the pads may act as an extension of an electrode in contact with it. In some embodiments, the electrical conductivity of the material from which the pads are formed is the same as or similar to the electrical conductivity of one or both of the electrodes.

The depositing of fluid such that at least the portion of a first one of the is in contact with the fluid is preferably performed such that at least a portion of a first one of the pads is immersed in the fluid.

The first electrode being positioned so as to provide an effective first electrode end position from which the electric field is applied may refer to the positioning of the first electrode either in contact with, or not in contact with, a further conductive member. This will typically effect where the effective first electrode end position is provided. For example, the first electrode may be positioned such that the end of the first electrode itself is coincident with the deposited fluid and itself defines the effective first electrode end position, the first electrode may also be positioned to be in electrical contact with the part of another conductive member, for example a pad disposed on the surface or an elongate structure formed on the surface, that is coincident with the deposited fluid. In such a case, the effective first electrode end position is typically coincident with a part of that other conductive member.

The providing of an effective first electrode end position from which the electric field is applied may be thought of as positioning the electrode so as to transmit the electric field through or via that position.

Thus the first electrode may be positioned such that the effective end position thereof is part of, that is to say located at part of, the first electrode, or such that it is part of any member formed from conductive material and in an electrical connection with the first electrode. That is, the effective first electrode end position may be extended from the end of the first electrode to the end of another conductive member by bringing the first electrode into direct or indirect electrical contact with that member.

The effective first electrode end position being coincident with the deposited fluid may refer to the position being either inside or within the volume of deposited fluid, or at a surface of the deposited volume. Thus the material at the effective first electrode end position through which the electric field from the first electrode is applied is typically in contact with the volume of fluid, either at its surface or within its interior volume.

The second electrode being in contact with the first pad is typically performed by causing the second electrode to contact the first pad.

In some embodiments, the plurality of nanoparticles being assembled to form an elongate structure extending along at least part of the distance involves those nanoparticles being assembled to form an elongate structure extending towards the portion of the first pad. That is, the elongate structure may grow from the first electrode, or from a pad or elongate structure in electrical connection therewith, towards the portion of the first pad. Alternatively, the direction of growth of the elongate structure may be controlled such that it occurs in the reverse direction, that is so that the structure extends from the portion of the first pad to the effective first electrode end position. The direction of structure growth may be controlled by way of a DC bias component of the applied alternating electric potential.

In embodiments wherein the electric field is applied so as to cause the direction of structure growth to be from the effective first electrode end position towards the first pad, the effective first electrode end position, which typically corresponds to the growing end of the elongate structure, that is the end of the structure upon which assembly of nanoparticles is taking place, will move along the distance between the initial effective first electrode end position and the first pad together with the growing end, as the length of the structure increases. In this disclosure, the effective first electrode end position generally refers to its location prior to the elongate structure being formed, rather than its location as may be moved along with the growth of the structure.

The distance between the effective first electrode end position and the portion of the first pad typically refers to the structure extending across the spacing between the effective first electrode end position and the portion of the first pad. That is, across the substrate surface between the end position and pad portion.

Typically, the elongate structure growth occurs in a direction collinear with an axis joining the effective first electrode end position and the pad portion, therefore the elongate structure is typically a straight line aligned with that axis.

Typically, the field is applied until the elongate structure extends so as to contact, or make electrical contact with, both the portion of the first pad and the continuation of the first electrode, that is the portion of conductive material coincident with the effective first electrode end position.

The second electrode that is used to apply the electric field during the formation of the further elongate structure, that is the second electrode that is in contact with the further pad, may be the same second electrode that is used to apply the electric field during the formation of the first elongate structure. In this case, the second electrode is typically moveable with respect to the first electrode and/or the substrate. The first electrode may be immovable or fixed with respect to the substrate, in some embodiments, wherein one or more connected structures may be formed by way of moving that second electrode to one or more corresponding further pads. It is also possible, however, for the second electrode that is used to apply the electric field during the formation of the further elongate structure, that is the second electrode that is in contact with the further pad, to be different from the same second electrode that is used to apply the electric field during the formation of the first elongate structure. In this sense the ordinal "second" as applied to an electrode may be understood as referring to the second of two electrodes being used to apply an electric field to form a particular elongate structure. In other words, a "second electrode" may be thought of as a "pad-activating electrode" or a "pad-contacting electrode", and one or more such electrodes may each be used to contact one or more pads. In some embodiments, it may be desired to use a different second electrode for each respective further pad to form each of a number of respective further structures. In some embodiments, any of one or more possible "second" electrodes, that is electrodes that cooperate with the first electrode to apply the electric field to the fluid, may be used to form one or multiple elongate structures between one or multiple pairs of pads. In this disclosure, where the term "the second electrode" is so used, with the definite article, this should be understood as generally referring to the electrode that is used to form the first elongate structure, rather than describing only embodiments wherein only a single pad-contacting electrode is used to activate multiple pads. No such restriction is intended.

Although the disposed pads may advantageously be used with any combination or arrangement of two or more electrodes to activate the said pads and thereby effect the precise DEP-induced structure assembly therebetween, it is particularly advantageous to make use of a single pair of electrodes to form multiple structures between multiple pairs of pads. This can be achieved, for example, by providing a pair of electrodes at least one of which is moveable with respect to the other and/or with respect to the substrate. In preferred embodiments, therefore, the second electrode is movable with respect to the first electrode and the substrate, and the second electrode being in contact with each pad during the applying of an electric field is caused by moving the second electrode with respect to the substrate so as to bring it into contact with each pad in succession.

In a preferred embodiment, the second electrode is movable with respect to the first electrode and the substrate, and the method comprises bringing the second electrode into contact with the first pad so as to cause the first pad to act as a continuation of the second electrode. Using each further pad, the positions of which on the substrate can be precisely configured and/or predetermined, as an extension of an electrode through which the DEP-inducing electric field is applied allows the said field to be applied quickly, without comprising on the precision with which the nanoparticles are directed to assemble by the DEP forces. Therefore, applying the second electrode to each further pad to form a corresponding elongate structure in this manner facilitates the rapid and precise creation of compound structures comprising multiple elongate structures, which may be as large and complex as desired, depending on the number of further pads disposed on the substrate activated by the electrode during the process and on the pattern thereof.

The second electrode may be movable with respect to the substrate. The substrate may be fixed or stationary with respect to the first electrode and the second electrode may be movable with respect to the first electrode accordingly.

The first pad acting as a continuation of the second electrode typically refers to the first pad transmitting an electric field from the second electrode to the third. Additionally, the first pad acting as a continuation of the second electrode typically means that the second electrode is defined so as to provide an effective second electrode end position coincident with the first pad, or a part thereof.

In some embodiments, when applying the electric field to the fluid: the first electrode is in contact with the fluid such that the effective first electrode end position corresponds to an end part of the first electrode that is in contact with or immersed within the fluid, or the first electrode is in contact with a conductive member such that the effective first electrode end position corresponds to a part of the conductive member.

The end part is preferably a part of the first electrode that is shaped so as to be able to protrude into or at least contact the volume of deposited fluid. The end part may be any part of the electrode that is suitable for contacting the fluid so as to define an effective electrode end.

The conductive member may be a second one of the pads. The conductive member may also be an elongate structure, or a portion thereof, formed upon the provided substrate. For instance, a structure may exist upon the substrate having been formed previously by a prior performance of a method according to the first aspect.

The effective first electrode end position typically corresponds to a part of the conductive member from, or through which, the electric field from the first electrode is applied.

As noted above, the positioning of the first electrode typically effects where the effective first electrode end position is provided. Thus, typically, when applying the electric field to the fluid the first electrode is in contact with the fluid such that the elongate structure extends from the first electrode towards the portion of the first pad; or the pads comprise a second pad, at least of portion of which is in contact with the fluid, and when applying the electric field to the fluid the first electrode is in contact with the second pad such that the elongate structure extends from the portion of the second pad towards the portion of the first pad.

Typically, the elongate structure extending from the first electrode comprises the elongate structure being assembled such that one end of it is in contact with the first electrode. A DC bias component of the applied electric potential may be controlled so as to cause agglomeration of fluid-dispersed nanoparticles to begin upon the first electrode in particular, and to cause the structure growth to continue from that region towards the first pad.

The second pad being in contact with the fluid preferably comprises at least a portion of the second pad being immersed in the fluid. However, the method may be performed by depositing fluid so as to contact any of the pads at a surface of the deposited volume of fluid only.

The first electrode being in contact with the second pad may cause the second pad to act as another extension of the first electrode. Thus the second pad can transmit the electric field from the first electrode.

The structure extending from the portion of the second pad towards the portion of the first pad may comprise the structure being assembled between the pads or from any point in a volume of deposited fluid towards the first pad.

Advantageously, once the elongate structure has been formed, a further elongate structure may be formed in addition by causing dielectrophoretic assembly of fluid-dispersed nanoparticles from or towards a further pad that is disposed on the substrate.

The deposited fluid, which is coincident with the effective first electrode end position when the alternating electric field is applied therefrom so as to form the further elongate structure, may be either the same volume of fluid as that which is used to form the first elongate structure. That is, a single volume of fluid may be deposited and used to create both the first and further structures therein. This typically involves that single volume of fluid being deposited so as to define a wetted area covering both the first and further pads as well as the initial first electrode position. That area may be arranged so as to follow, or have the same morphology as, the desired shape of either or both of the first and further elongate structures. Alternatively the wetted area may be more extensive, and may for example be in the form of a film covering a larger region that includes the desired structure linear assembly areas. In some embodiments, however, it is advantageous to deposit a separate volume of fluid, not connected to or contacting any other, for each elongate structure to be formed.

Thus the fluid that may be deposited so as to contact the further pad may be a part of or joined to the same volume of fluid as that used to form the first elongate structure. As such, the fluid contacting the further pad could be deposited at the same time as that fluid, or at a different time, so that the two deposited volumes are joined. The further pad-contacting fluid could be a separate deposit or volume of fluid, deposited at a different time or at the same time as the first deposited volume. As such, the fluid could be of the same type, and each deposited volume of fluid may contain the same type of nanoparticles or may contain different types of nanoparticles.

While it may be beneficial in some embodiments to deposit fluid of a single type onto the substrate, so that fluid of the same type, or formed from the same material, contacts a plurality of conductive pads. In some embodiments, however, it may be advantageous to use one or more different fluids. The fluid deposited so as to contact the portion of the further pad and the fluid deposited so as to contact the portion of the first pad may accordingly comprise, or be formed from, different materials. In particular, nanoparticle-containing fluids of one or more different types, wherein each different type comprises a different solvent, may be deposited onto the substrate. Different fluid materials or solvents may be suitable for containing dispersed nanoparticles of different types, and so the use of different fluids may be advantageous in cases where, for instance, elongate structures formed of different materials are required.

The fluid to which the alternating electric field is applied so as to fabricate the further elongate structure refers to the fluid with which the portion of the further pad is in contact, whether this is part of the same volume of fluid with which the portion of the first pad is in contact, or a different or separate volume of deposited fluid. The electrode positioned so as to provide a further effective electrode end position is preferably the first electrode, but could be a different electrode in some embodiments. The further effective electrode end position that is provided is typically different from, that is at a different location to, the effective first electrode end position. The electrode in contact with a further pad is preferably the second electrode. However, this may in some embodiments be a different electrode. The electrode being in contact with a further pad typically comprises bringing the second electrode into contact with the further pad so as to cause the further pad to act as a continuation of the second electrode.

However, in some embodiments, it is preferable to utilise more than two electrodes. Thus, the electrode that contacts the further pad may be a third electrode. In some embodiments, the formation of first and further elongate structures may be overlapping in time or simultaneous. Such higher-efficiency production techniques may involve, for example, adjacent electrodes being configured to transmit electric fields with alternating polarity and being spaced so as to simultaneously contact adjacent pads disposed on a substrate. The use of a three-electrode arrangement, for instance, would allow the third electrode to be used to form a second elongate structure concurrently with the formation of the first elongate structure using the first and second electrodes.

Further, in some embodiments, the electrode that is positioned so as to provide a further effective electrode end position is a fourth electrode, so that the further effective electrode end position is an effective fourth electrode end position. Thus, for instance, a four-electrode technique may be used to produce two elongate structures at a time, with the third and fourth electrodes acting as a second pair of electrodes analogous to the first and second electrodes. Additionally, in some embodiments, a third elongate structure may be formed concurrently with the formation of first and second elongate structures.

The formation of first and further elongate structures may be overlapping in time or simultaneous, and can be physically spaced apart in embodiments wherein two pairs of electrodes are used.

The effective fourth electrode end position may correspond to an end of the fourth electrode, or to a part or end part of a conductive member that is in electrical contact with the fourth electrode.

Therefore, in some embodiments, the time during which the electric field is applied so as to form the first elongate structure overlaps at least partly with the time during which the electric field is applied so as to form the further elongate structure. That is, the first and further elongate structures may be formed at least partly simultaneously, by way of applying an electric field to two regions of fluid so as to cause dielectrophoretic assembly in each region, using three or four electrodes. The aforementioned times may overlap partially or completely. The forming of one elongate structure may be started, stopped, or performed simultaneously or substantially simultaneously with the forming of the other structure.

The fluid with which the portion of the further pad is in contact may be positioned so as to contact a conductive member that is electrically connected to the first electrode.

In embodiments wherein more than two structures are formed, three or more structures may be formed substantially simultaneously by using additional electrodes and possibly additional pads. As noted above, in some embodiments the elongate structure may be caused to interconnect the first pad portion and the effective first electrode end position. The ability to create different segments of a line, formed from elongate structures, in parallel greatly improves the speed of the fabrication process with respect to prior art methods.

Using the method, multiple structures may be formed from nanoparticles dispersed in multiple volumes of fluid, which may be deposited separately on the substrate or may be joined together. The fluid in each volume may be formed from a different material, and in particular may comprise a different solvent.

The elongate structure connecting the first pad and the effective first electrode end position may involve the elongate structure extending so far as to reach, contact, or be joined to, or to make electrical connection with, be it direct or indirect, the first pad or the effective first electrode end position, depending upon the direction of growth. The fluid with which the portion of the further pad is in contact may be positioned so as to contain the conductive member alluded to above. The conductive member may be a portion of conductive material, and thereby that member or a portion thereof may contain the effective first electrode end position.

Using the method, the first and further elongate structures may be formed sequentially. Thus more than two elongate structures can be formed in a sequence. That is, two or more elongate structures may be formed one after the other. As described above this can be achieved by moving the second electrode to activate different pads, that are disposed on the substrate, in sequence.

This approach facilitates the production of long compound structures, by reducing the requisite applied voltage for a given length of compound structure. Forming an elongate structure of a given length by way of prior art techniques using a floating second electrode typically involves the electrical resistance of the structure increasing as the length of the growing line increases. Accordingly, the magnitude of the applied electric potential as the structure is typically increased in order to maintain the desired electric field strength and gradient in the region of dielectrophoretic assembly. However, increasing the applied voltage in this way can lead to the structure being disrupted or damaged owing to various effects, including increased resistive heating as a result of the increased current magnitude.

The above described assembly technique involving conductive pads advantageously avoids this requirement for excessive applied voltages. Forming a compound elongate structure by forming a plurality of elongate structures connected together in a line by conductive pads results in the elongate structure comprising suitable contact points, in the form of the conductive pads, with which the first electrode can be caused to make electrical contact as further elongate structures in the compound structure are being grown. In this way, the first electrode may be moved so that it makes electrical contact with a pad in the compound structure, so as to decrease the length of the portion of the compound structure between the first electrode and the effective first electrode end position. Rather than maintaining the first electrode in its initial position throughout the formation of a compound structure, the first electrode may be brought into electrical contact with the compound structure at a location that is closer to the effective first electrode end position, without the need for the electrode to be brought into physical contact with a recently assembled elongate structure, which is relatively fragile compared to the pads. Thus, in some embodiments, the first electrode is moveable with respect to the substrate, and the method comprises moving the first electrode so as to bring it into contact with each pad in succession so as to decrease the length of the electrical path between the first electrode and the effective first electrode end position.

The second electrode may be moved with respect to the substrate and/or the first electrode. The second electrode may be moved so as to connect, one after the other, with each of the pads that it contacts. That is, the first pad and the one further pad. In some embodiments, there may be more than one further pad. Causing the second electrode to sequentially activate more than one pad disposed on the substrate allows the sequential formation of a plurality of elongate structures to form a pattern or compound structure of elongate structures and conductive pads on the substrate.

In other words, the second electrode may be movable with respect to the first electrode and the substrate, and the method may comprise moving the second electrode so as to cause the second electrode to contact each of the first and further pads, and thereby form the first and further elongate structures respectively, in succession.

In embodiments such as this, involving a conductive member, the conductive member may form part of the first pad or form part of another of the plurality of pads. The conductive member could also form part of the first elongate structure, or another elongate structure electrically connected to the first or another of the plurality of pads. In this way, it is possible to assemble a conductive compound structure formed from any combination of conductive pads and elongate structures, and then utilise that structure as a means for extending the effective end position of an electrode so as to apply an electric field from that electrode through that compound structure or a particular part thereof, so that further elongate structures can be formed from such extended effective electrode end positions.

In some embodiments involving a plurality of electrically conductive pads disposed upon the surface of the substrate, the method further comprises, for each of one or more additional ones of the plurality of pads: depositing fluid containing a dispersion of electrically polarizable nanoparticles onto the substrate such that at least a portion of the respective additional pad is in contact with the fluid, applying an alternating electric field to the fluid; applying an alternating electric field to the fluid using an electrode positioned so as to provide an additional further effective electrode end position coincident with the deposited fluid and spaced apart from the respective additional pad by a distance and another electrode in contact with the respective additional pad, such that a plurality of the nanoparticles are assembled to form a respective additional elongate structure extending along at least part of the distance between the additional further effective electrode end position and the portion of the respective additional pad.

Thus it may be possible to form a compound structure made from a plurality of elongate structures by performing the process multiple times so as to grow multiple structures towards, from, or between multiple pads. This formation of multiple structures can be performed in sequence, for example using the same first and second electrodes to form two or more of the structures. This could alternatively be performed simultaneously by using more than two electrodes. For example, two or more pairs of first and second electrodes may be used.

Preferably, the at least one conductive pad is affixed to the surface of the substrate. The affixing may be performed by any of a number of known techniques, such as laser ablation of metal onto a substrate. The affixing of a pad onto the substrate surface is advantageous in that it provides a conductive island structure that may be used to guide the formation of an elongate structure and is unmoving with respect to the substrate, thereby rendering the process more controllable. Additionally, the pads being securely attached to the substrate surface in turn causes the structure that is attached to such a pad to be secured to the substrate also.

In typical embodiments, the formation of multiple elongate structures by electrically activating multiple conductive pads on the substrate is performed by moving the second electrode through a series of discrete movements between the pads. However, it is also possible to introduce a degree of continuous movement of the second electrode, and this may be advantageous in embodiments wherein lower voltages are required or where a distance between two pads is so great that an excessively high voltage would be required in order to dielectrophoretically assemble a structure between them, which could cause damage to the structure. Therefore, in some embodiments, the method further comprises, before applying an alternating electric field to the fluid with the second electrode in contact with the first pad so as to form the elongate structure: applying an alternating electric field to the fluid using the first electrode and the second electrode, with the second electrode positioned between the effective first electrode end position and the first pad, so that a plurality of the nanoparticles are assembled to form an initial elongate structure extending from the effective first electrode end position towards the second electrode, and increasing the separation between the effective first electrode end position and the second electrode by moving the second electrode towards the first pad so as to further extend the initial elongate structure towards the first pad, wherein, when an alternating electric field is applied to the fluid with the second electrode in contact with the first pad, the end of the elongate structure that is proximal to the second electrode corresponds to the end of the initial elongate structure, such that the elongate structure is formed as an extension of the initial elongate structure.

During this process, the first electrode may be positioned so as to define the effective first electrode end position to be coincident with the deposited fluid and spaced apart from the first pad by a distance. The moving of the second electrode towards to the first pad may involve moving the second electrode away from the effective first electrode end position. The resulting extension of the initial elongate structure towards to the first pad may comprise the initial elongate structure extending towards the second electrode.

As noted above, such an approach is advantageous when the separation between pads is so great that the magnitude of electric potential required to cause dielectrophoretic assembly of a structure from one pad to another is too great, and involves too great a risk of damage to the structure or deleterious effects. The use of a moving second electrode to assemble the structure part of the way along the distance, and then the application of electric potential to the pad once the remaining distance between the pad and the structure is sufficiently small to allow a non-damaging electric potential to be used to assemble the remaining section of the elongate structure provides a way of mitigating damage to the structure in embodiments with such spacings or configurations. This procedure may be performed or repeated one or more times so as to form a plurality of elongate structures across the respective distances between respective pairs of pads.

Therefore, the method can involve moving the second electrode, or a printing head comprising the second electrode, in either or both of a discrete manner, in which the printing head only touches the conductive pads, or a continuous manner, wherein structure growth between pads is partly caused by drawing the growth of the line using movement of the second electrode.

Typically, the method further comprises removing the fluid such that the elongate structure remains upon the substrate. The drying process may cause the formed structure in a dried region to be physically stronger and more robust, and more strongly adhered to the substrate surface. Therefore, drying the fluid around each structure in a plurality of structures formed as part of a compound structure, for example, as each segment of the compound structure is formed reduces the risk of a formed structure deteriorating or being damaged during the creation of other parts of the compound structure.

Although conductive pads having any of a number of shapes may be used, it is preferable to provide conductive pads comprising one or more corners. This is because the parts of the periphery of a pad that have the smallest curvature radius typically, when the pad is electrically activated by contact with an electrode, correspond to regions at which the electric field intensity and electric field gradient is greatest. Therefore, in preferred embodiments, each of the pads occupies an area of the substrate surface having a shape comprising at least one corner. That is, the footprint or the substrate area that is covered by each pad may have a shape including one or more corners. For example, preferred embodiments may involve the use of one or more pads having the shape of a rounded rectangle, or a rectangle, and in particular a square. A corner may be thought of as a sharpened or tapered part of the edge or outline or periphery of a conductive pad.

The presence of one or more corners may result in a more controllable DEP growth process, since the smaller dimensions of the one or more corners of each pad may allow the points with the induced electric field at which structure growth begins, or towards which structures grow, to be more precisely defined.

In preferred embodiments, the method comprises forming a plurality of elongate structures connected to each of the pads. Typically, each of the elongate structures is formed so as to be connected to, at one or each end of the structure, a corner of a respective pad.

The method advantageously provides the ability to obtain arbitrary geometries of printed compound elongate structures, which may not necessarily be restricted to straight lines of collinear elongate structures. The geometry of such compound structures may be determined by the position and shape of the islands.

In addition to the creation of arbitrary geometries, the use of the method to produce compound structures comprising multiple elongate structure segments allows the resistivity for each segment to be measured individually, during fabrication of the compound structure. This is advantageous for monitoring and controlling the fabrication process.

Moreover, building a compound structure segment-by-segment between pairs of pads also advantageously facilitates forming a line or compound structure formed from multiple different materials. For example, each segment of a line or compound structure may be made by way of depositing volumes of ink between different pairs of pads and containing different types of nanoparticles.

In some applications, it is desired to form a conductive grid of elongate structures upon a substrate. The method advantageously facilitates this also. Therefore, in some embodiments, four or more of the electrically conductive pads are disposed in a regular array pattern upon the surface of the substrate, and the method comprises forming a plurality of elongate structures interconnecting the pads in the array such that a plurality of the interconnecting elongate structures are connected to each of at least one of the pads in the array.

In this way, a conductive grid may be formed. Each of the array pads, that is pads that form part of the array, may be connected to a plurality of structures. A pad may have corners, each of which may be suitable for connecting to an elongate structure. For example, each pad, which may preferably be rectangular in shape and comprising four corners, may be connected to four interconnecting elongate structures, with each structure being connected to a respective corner.

Interconnecting structures connected to a pad in the array may have differing orientations upon the substrate. For example, different structures may lie substantially orthogonally to one another on the substrate surface.

An advantage of the method is the ability to form a conductive grid of lines quickly using regularly arranged pads, with the conductive paths intersecting other pads. Such an undertaking would be significantly slower using methods of the prior art, in particular those wherein a moving second electrode is required to draw or print structures. Four electrically conductive pads may be arranged in a rectangular or other quadrilateral pattern. Thus grids of any size, comprising, for example, four or more pads may be formed using the method. The presence of five electrically conductive pads, for instance, can represent a small grid, which may be arranged in a "+" pattern, with one pad corresponding to each line end, and one pad corresponding to the centre of the symbol. It is envisaged that conductive grids of arbitrarily large size may be formed using the method, by providing arrays of disposed pads that are correspondingly large in number. For example, the array may comprise nine or more, or sixteen or more pads. The method may be used to interconnect or connect any number of pads.

Typically, each of the pads is formed from a metal material.

Typically, the alternating electric field is applied by way of applying to the electrodes an AC voltage that includes a DC bias so as to control the direction in which the growing structure is assembled. Thus the DC bias may be configured such that a first end of the structure is formed by mobile nanoparticles within the fluid attaching to the effective first electrode end position. In other words, as with the prior art methods of dielectrophoretic assembly, a DC bias may be used to control the electrode, or in the presently disclosed method the effective extension thereof, upon which the structure begins to form, and also therefore the direction of growth or assembly.

According to a second aspect of the invention, an assembly obtained by the method according to the first aspect is provided, the assembly comprising a substrate having a plurality of electrically conductive pads disposed on a surface thereof, wherein each of the plurality of pads is electrically connected to one or more elongate structures formed upon the surface of the substrate, each of the one or more elongate structures having a width less than 10 μm, wherein the plurality of pads are interconnected by the one or more elongate structures. Such an assembly, in which any combination of one or more of each of dielectrophoretically assembled elongate structures and conductive pads are joined together on a substrate surface is advantageous in that it can be assembled with ease and speed by way of the method according to the first aspect, and in that it may be formed so as to have any arbitrary size or geometry of compound structure. Thus the assemblies may be produced efficiently, and may be adapted for any number of different applications requiring conductive structures comprising ultra-narrow lines upon a substrate.

It will be appreciated that the method permits the formation of ultra-narrow elongate structures. Accordingly, in some embodiments, the one or more elongate structures formed upon the surface of the substrate have a width less than 1 μm. One or more structures having width so 2 μm, 3 μm, and 5 μm, for instance, are also envisaged. The width may be defined as the average structure width, or the maximum width, for example, with width corresponding to linear extent of the structure in a transverse axis, that is an axis orthogonal to its length or elongate axis at a given point and preferably parallel to the plane of the substrate at that point.

In particular, grids or interconnected networks of line structures, which may intersect with one another, may be desired for some applications.

It is also possible to provide assemblies comprising advantageously long elongate structures as part of compound structures or grids formed upon the substrate, for example. Therefore, at least one of, or each of, the one or more elongate structures has a length greater than 10 μm. More preferably, at least one of, or each of, the one or more elongate structures has a length greater than 100 μm. In this disclosure, the length of an elongate structure refers to its linear extent in the elongate direction, which corresponds typically to the dimension in which the linear extent of the structure is greatest.

More preferably still, at least one of, or each of, the one or more elongate structures has a length greater than 4 mm. Such elongate structures are typically formed using the continuous electrode movement technique described in connection with an embodiment of the first aspect. While the use of continuous movement of the second electrode during dielectrophoretic structure assembly facilitates the formation of structures that, as well as being ultra-narrow, are long, for example with lengths of the order of millimetres, this moving-electrode technique may also be employed in the forming of structures much shorter than 4 mm. For instance, in some embodiments of the assembly wherein an elongate structure of which has been formed using continuous electrode movements between conductive pads, the elongate structure may have a length of the order of a few hundred micrometres. Indeed, the use of the moving-electrode approach may be advantageous in the production of structures with such dimensions. In embodiments wherein the creation of the assembly involves only discrete electrode movements from pad-to-pad to form a given elongate structure, the length of the structure, or of each structure of the assembly, is typically between 100 μm and 2 mm.

In accordance with a comparative example there is provided an apparatus for forming a structure on a substrate upon a surface of which one or more electrically conductive pads are disposed, the apparatus comprising: a print head for depositing fluid containing a dispersion of electrically polarizable nanoparticles onto a substrate such that at least a portion of a first one of the one or more pads is immersed in fluid deposited by the print head, a first electrode and a second electrode for applying an alternating electric field to fluid deposited by the print head when the second electrode is in contact with the first pad, wherein the second electrode is movable with respect to the first electrode.

Advantageously, the apparatus is capable of providing structures comprising ultra-narrow lines utilising electrically conductive pads disposed upon a substrate. Thus the apparatus may efficiently and controllably produce assemblies comprising such structures and configured to include an arrangement of pads and elongate structures in any arrangement according to the particular application.

The first and second electrodes can be suitable for applying the field to the fluid where at least the first electrode is in contact with the fluid. They can be suitable for applying the field when the first electrode is in direct or indirect electrical contact with the fluid. For example, the first electrode could be adapted to be caused to contact a conductive pad or a formed or forming elongate structure that is in electrical contact with the fluid. In such cases the point of the structure to which the first electrode is contacted may or may not be in contact with or immersed in the fluid.

The second electrode being movable with respect to the first electrode typically comprises the second electrode being movable such that it can be caused to contact the first pad. Furthermore, when a number of the pads are disposed on a substrate, the second electrode may be movable so as to be able to contact any of the multiple pads. Thus, in preferred embodiments, the apparatus is suitable for forming a structure on a substrate upon a surface of which a plurality of electrically conductive pads are disposed, wherein the second electrode is movable with respect to the first electrode such that the second electrode can be caused to contact at least a first one and a second one of the plurality of pads.

In such embodiments, the apparatus may be capable of electrically activating two or more pads on the surface one at a time. That is, the apparatus can cause those pads to act as an extension or continuation of the second electrode and accordingly transmit the electric field from the second electrode through each pad when it is contacted by the second electrode. Thus it may be possible to use such an apparatus to create a compound structure by growing multiple elongate structures towards, or from, respective multiple pads upon a substrate surface.

In some embodiments, the apparatus comprises a plurality of further electrodes, wherein the apparatus is configured to form a plurality of elongate structures substantially simultaneously. The inclusion of a multi-electrode print head, for example, in such an apparatus would allow the fabrication of large or complex compound structures comprising multiple constituent elongate structures in a rapid manner. In preferred embodiments, the arrangement of electrodes on such a multi-electrode print head corresponds to the arrangement of conductive pads upon the substrate surface, for example, the relative arrangement of electrodes on a print head with respect to one another may correspond to, or be the same as, the relative arrangement of disposed pads with respect to one another. In some embodiments, the spacing between electrodes on a print head is equal to, or substantially equal to, the spacing between one or more pair of pads disposed on a substrate. Such a correspondence between electrode and pad arrangements allows the rapid and simultaneous formation of multiple elongate structures at once.

In some embodiments, the apparatus further comprises a substrate upon a surface of which one or more electrically conductive pads are disposed.

BRIEF DESCRIPTION OF THE DRAWINGS

Examples of the present invention will now be described, with reference to the accompanying drawings, wherein like reference numerals indicate like features, and in which.

DESCRIPTION OF EMBODIMENTS

Figure 1:
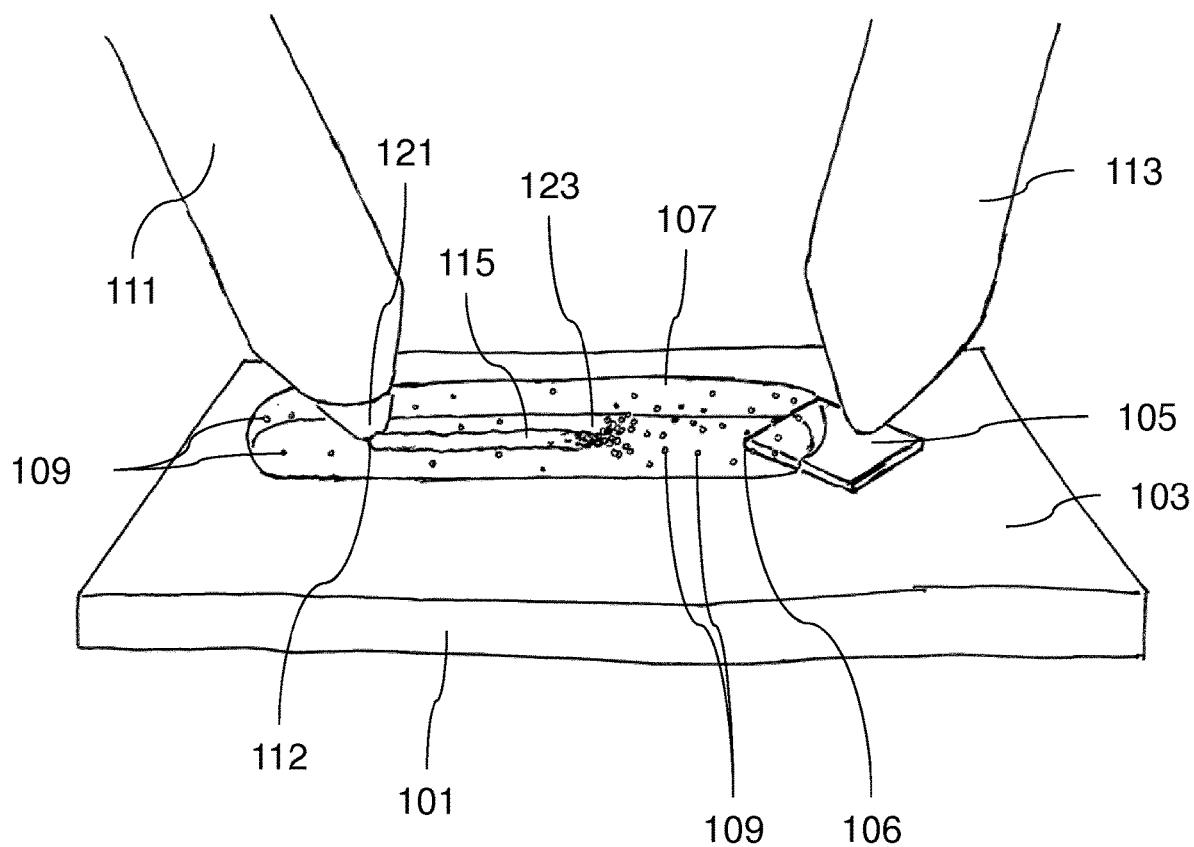
FIG. 1 is a perspective view of an elongate structure being formed upon a section of a substrate in accordance with a first example method of the invention.
Figure 3:
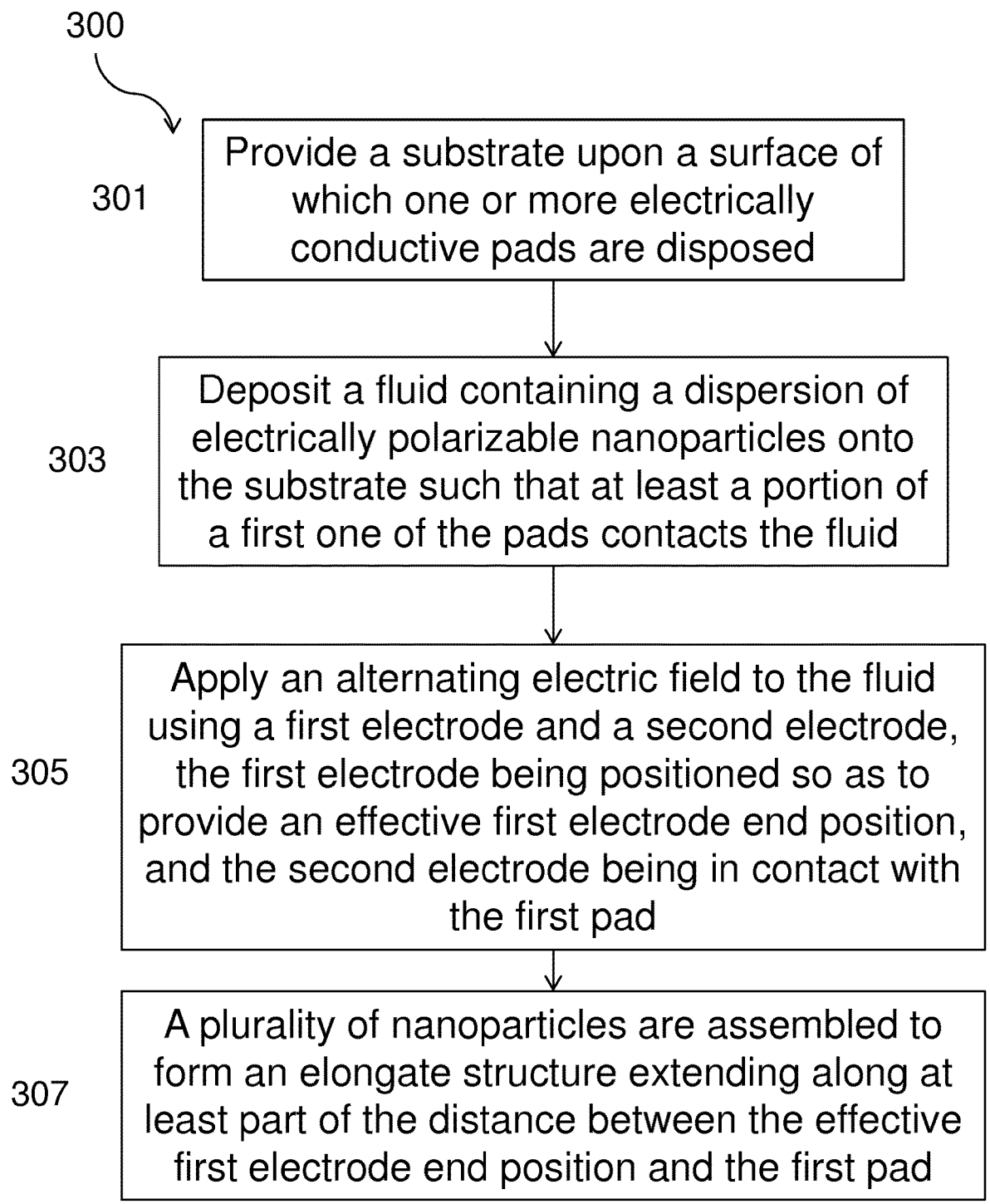
FIG. 3 is a flow diagram showing steps of a method according to the invention.

With reference to FIGS. 1 and 3 a method 300 of forming a structure upon a substrate is now described. The method begins at step 301 in which a substrate 101 is provided. The substrate comprises a glass sheet or plate. Alternatively, the substrate may be formed from or comprise an electrically insulating foil. In the present example, the upper surface 103 of the depicted section of substrate 101 has disposed upon it an electrically conductive pad 105. The pad 105 is formed from a metal material, and may be thought of as a conductive island disposed on the comparatively electrically insulating substrate 101. The pad is substantially flat, in that its thickness, that is linear extent in the direction normal to the plane of the substrate surface 103, is significantly smaller, by more than an order of magnitude in the present example, than its width and length, that is its linear extent in the directions parallel to the plane of the substrate surface 103.

The pad 105 is substantially square, with width and length of 100 µm.

The pad may be disposed upon the surface by way of a number of different techniques. Such methods of deposition are well known, and are outside the scope of this disclosure. In the present example, the pad 105 has been provided upon the surface 103 by way of laser ablation, that is laser patterning.

At step 303, a volume of fluid 107 is deposited onto the substrate surface 103. The fluid 107 contains electrically polarizable nanoparticles 109 in the form of silver nanoparticles each having a diameter of 100 nm. The mass fraction of the nanoparticles within the fluid is 0.2%. The nanoparticles 109 are dispersed throughout the fluid 107. The main component of the fluid is a solvent in the form of ethylene glycol. The fluid also contains a stabilizer in the form of glucose, which has a mass fraction within the fluid of 0.6%.

The depositing step 303 is performed, in the present example, by capillary force deposition (not shown). The fluid is disposed along a straight line across the substrate surface 103, thus defining a wetted region having an elongate shape, that is having a length dimension substantially greater than its width dimension.

The features depicted in FIG. 1 are, for illustrative purposes, not shown to scale.

The width of the wetted region is shown as being approximately 100 µm, and the length is shown as being approximately 500 µm. However, these dimensions may differ in practice according to the physical properties of the fluid and the method and configuration of the deposition step.

The volume of fluid 107 is deposited at step 303 in such a way that the deposited volume of fluid partially covers the pad 105. In particular, in the present example the wetted region is chosen such that the portion 106 of the pad 105 that is immersed within the fluid 107 comprises a corner of the square pad. This is because the corners of the pad 105 are the most favourable places for attachment to forming elongate structures. This is due to the electric field strength and the electric field gradient being greatest at corners, or other parts of bodies having comparatively small curvature radii. These regions of greater electric field intensity and gradient are conducive to controlled DEP structure assembly.

At step 305, a first electrode 111 is introduced to the fluid 107. As shown in FIG. 1, the tip 121 of the first electrode 111 is immersed in the deposited fluid volume 107. The first electrode is positioned such that the end of the tip 121 is in contact with, or is very close to, the surface 103 of the substrate 101. This is so that, when the elongate structure 115 is formed with one end at the tip 121, the structure 115 is resting on or supported by the substrate surface 103, thereby lessening the risk of damage to the structure, which would be greater were the structure to be formed floating above the surface 103.

The proximity of the first electrode end part 121 to the substrate surface may vary between examples. In the present view, the distance between the first electrode 111 and the surface 103 of the substrate is shown as approximately corresponding to the expected or predetermined or configured height dimension of the structure to be assembled. That is, the electrode is shown as being positioned at such a height that the structure to be formed from the tip 121 of the electrode is assembled very close to, or in contact with, the substrate surface 103. However, the height of the assembled structure may be independent of the height of the electrode above the substrate surface. In some embodiments, the height of the electrode end within the fluid volume is such that the line structure is assembled floating in the fluid, and is subsequently brought into contact with the substrate during a later, drying stage. The height of the elongate structure, that is the measurement of the structure from top to bottom, may be approximately the same as the width of the structure, such that the structure may have an approximately cylindrical shape with an aspect ratio of approximately 1.

Also at step 303, a second electrode 113 is brought into contact with the pad 105.

The electrodes 111, 113 are formed from gold and are connected to a circuit configured to produce a controllable electric potential, which may additionally comprise a device for providing an indication of the electric potential across the two electrodes, which may be a voltmeter or potentiometer.

By configuring the electric circuit to generate an alternating electric potential across the electrodes 111 and 113, an alternating electric field is applied to the fluid on the region.

In the present example, the first electrode 111 being positioned, prior to the formation of any elongate structure 115, within the fluid 107 and not in contact with any similarly electrically conductive member or material, means that the effective first electrode end position 112, through which the electric field is applied, corresponds to the end of the electrode tip 121 itself.

The alternating frequency and amplitude, and the magnitude of the DC bias of the applied electric field, together with the chosen starting distance between the first electrode 111 and the pad 105 are such that the electric field strength and gradient present at the region between the effective first electrode end position 112 and the portion 106 of the pad 105 results in the polarizable nanoparticles experiencing a dielectrophoretic force which causes them to begin to assemble together upon the first electrode 111. In the present example, the voltage applied across the electrodes has an AC frequency of 10 kHz, an AC amplitude of 70 V, and a DC bias of 1.5 V. A current is thereby applied, having an AC amplitude of 400 µA and a DC bias of 1 µA. The inhomogeneous electric field is conducive to assembly via dielectrophoresis, not least because of the gradient or diversions of the electric field towards each of the electrode 111 and the pad portion 106 generating the field. The shape of the electrode 111, like that of the pad 105, is selected in part in order to produce such an inhomogeneous electric field, in that the electrode 111 has an elongate structure and preferably a pointed end part.

The potential applied to the electrodes 111, 113 is additionally configured to have a DC bias that results in nanoparticles assembling by preference upon one of the two electrodes, which in this case is the first electrode 111.

As a result of the electric field being applied, at step 307 a plurality of nanoparticles 109 are assembled to form an elongate structure 115 extending from the first electrode 111 towards the pad 105, which acts as a continuation of the second electrode 113, with which it is in electrical contact. The plurality of nanoparticles that are assembled corresponds to those nanoparticles within the fluid 107 that are sufficiently close to the region of space wherein the electric field conditions are beneficial for assembling the particles via dielectrophoresis, in that they are attracted to and agglomerate upon the electrode 111 so as to begin forming the structure 115.

Owing to the direction of the electric field between the electrodes, as the structure 115 grows via the progressive addition to the structure of particles 109 within the fluid 107, the assembling structure 115 grows or extends towards the pad 105.

In alternatives to the present example, the DC bias of the applied electric field may be reversed. This would result in the assembly of the structure 115 beginning at the portion 106 of the pad 105, with the structure 115 then growing or extending towards the first electrode 111.

As the elongate structure 115 is formed from a conductive material, specifically silver, the structure is a conductive member and effectively acts as a continuation of the first electrode 111, with which it is in contact, as the structure is being assembled. The structure 115 thereby effectively increases the extent of the first electrode 111, so that the electric potential applied to this electrode is transmitted through the structure, and so that the end part 123 of the structure acts as a new effective first electrode end position. That is, the electric field applied by the first electrode is applied through the growing end 123 of the assembling structure 115 as it grows along the distance between the first electrode tip 121, corresponding to the initial effective first electrode end position, and the corner of the pad portion 106.

FIG. 1 shows the structure 115 in a partially assembled state, having extended approximately halfway along the distance between the effective first electrode end position and the portion of the first pad. The growth of the structure 115 may be paused or halted by discontinuing the application of the electric field, or it may be continued until the growing end 123 of the structure 115 has reached the pad 105.

Once the structure 115 has been assembled as desired, the fluid may be removed from the substrate so as to leave the elongate structure 115 remaining upon the substrate. It may be beneficial to continue to apply the alternating electric field during the drying process. Keeping the AC signal on at this stage allows the dielectrophoretic assembly action to continue to maintain the nanoparticles in their assembled state until there is so little fluid remaining that the nanoparticles are no longer free or able to move. The signal may then be switched off after the nanoparticles have been fixed in their assembled positions within the structure 115 by way of the fluid having been removed. In the present example, substantially all of the nanoparticles which were initially present, at step 303, in the fluid on the substrate are concentrated into the nanoscale-width elongate structure 115.

At the end of the process, an ultra-narrow conductive silver line or wire 115, that is the elongate structure, is formed upon the substrate. It will be appreciated that the width of this line, as well as its height, will be substantially less than, and may preferably be three orders of magnitude less than the width and height of the deposited fluid.

Additionally, the drying process is accelerated by applying heat to one or more of the structure, the fluid, and the substrate. In the present example, heating the substrate or the fluid to a temperature of 130° C. for a period of 15 minutes causes the structure to be dried and stabilized. This application of heat causes the adhesion between the structure 115 and the substrate 101 to be increased, thus producing a stable ultra-narrow wire adhered to the substrate.

As an additional step, the assembly may be subjected to a sintering process, for example by way of heating to a temperature of 150° C. for a period of fifteen minutes.

Optionally, the formed elongate structure may subsequently be selectively plated using a galvanic bath or electrodeposition.

In cases wherein the alternating electric field is applied only until the elongate structure extends along part of the distance, rather than the full distance, between the initial effective first electrode end position and the first pad, the formation of the structure from nanoparticles dispersed throughout deposited fluid may be resumed later, so as to cause the elongate structure to be extended further along the distance.

Figure 2:
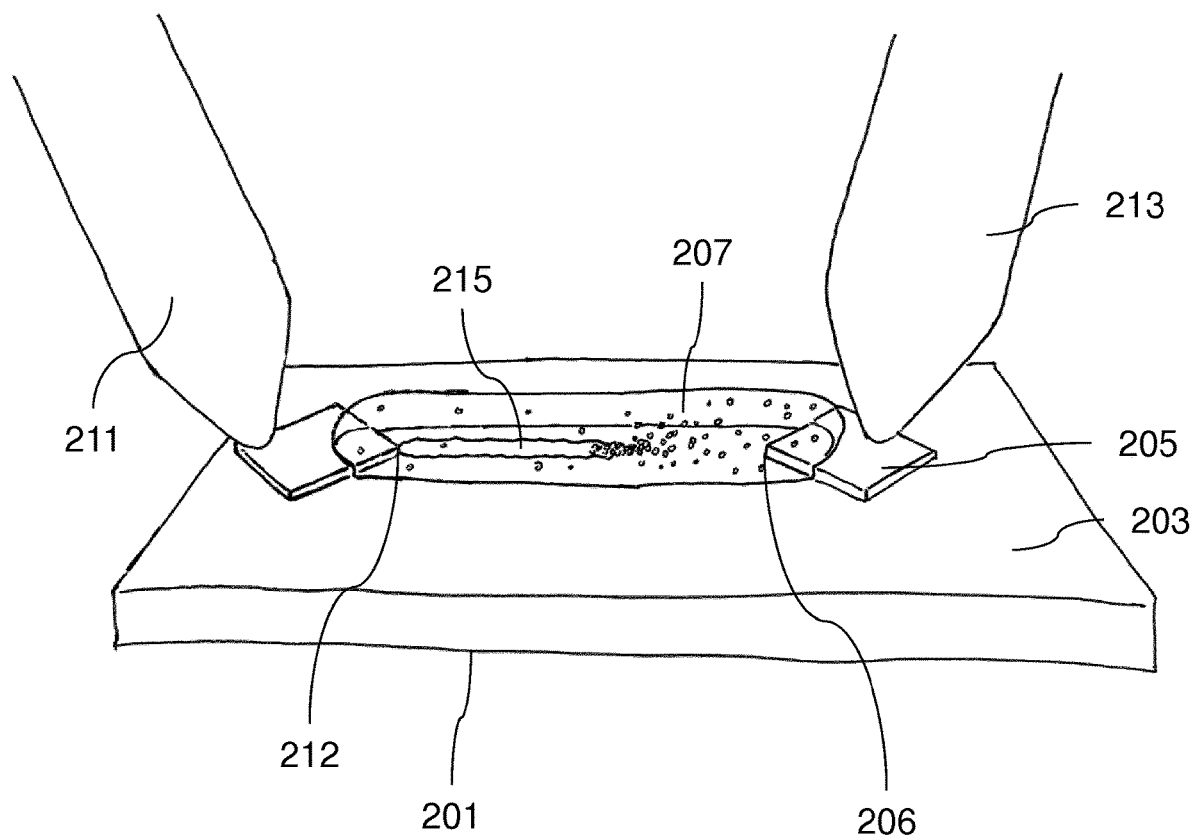
FIG. 2 is a perspective view of an elongate structure being formed upon a section of a substrate in accordance with a second example method of the invention.

With reference to FIG. 2, a second example method according to the invention which may be carried out using similar apparatus as used in the first example method is now described. The present example differs from the first example method in the positioning of the first electrode 211, and the presence of a second electrically conductive pad 208 on the surface 203 of the substrate 201. In the present example, the first 205 and second 208 pads are disposed upon the surface 203 and separated from one another by a distance of 2 mm, which is the same as the distance between the first electrode end 121 and the first pad 105 in the first described example.

The present example differs from that previous example in that the elongate structure 215 is formed between the two pads 205, 208, rather than between a pad and an electrode end. This is achieved by, when applying the alternating electric field to the fluid, positioning the first electrode 211 so that it is in electrical contact with the second pad 208. This causes the pad 208 to act as an extension of the first electrode 211, thereby causing the effective first electrode end position 212 to correspond to a position on the second pad 208. In practice, the contact between the first electrode 211 and the second pad 208 when an electric potential is applied to the electrodes 211, 213 causes an electric field to be applied by the second pad 208 as a whole, with the electric field intensity being greatest proximal to the corners of the square pad 208. As shown in FIG. 2, only one of the four corners of the square second pad 208 is in contact with the deposited fluid 207, hence it is that immersed corner which acts as the effective first electrode end position 212 and applies the electric field that is transmitted through the pad 208 to the fluid 207.

The assembly of the elongate structure 215 proceeds in the same manner as in the previously described example, and the structure 215 is caused to be formed along the distance between the corner of the second pad 212 and the corner 206 of the first pad 205.

As can be seen from the first two example methods, it is possible to assemble an ultra-narrow elongate line structure from fluid-dispersed nanoparticles, upon a substrate by providing a substrate comprising one or more conductive pads, selecting a pair of appropriately spaced pads or positioning an electrode an appropriate distance from a pad, and electrically activating one or two pads using a pair of electrodes to apply a DEP-inducing alternating electric field to the fluid. The above-described techniques may be used to form elongate structures of varying lengths. Although the separation between the first electrode 111 and the first pad 105 and between the second pad 208 and the first pad 205, in the first and second example methods respectively, is 2 mm, structures may be formed extending along longer or shorter distances, and thus longer or shorter elongate structures, may be formed by selecting, or disposing upon the substrate, pads with greater or smaller inter-pad distances, or by positioning an electrode further from or closer to the first pad.

In cases where longer structures are desired, the electric potential required to cause the dielectrophoretic assembly between the effective first electrode end position and the first pad will typically be greater, owing to the increased distance between these two points. For methods similar to the above described examples, wherein the distance along which the forming structure is to extend is around 4 mm, the requisite electric potential magnitude is so high that the excessive voltage is likely to cause the forming structure to be damaged, or to render the process less controllable, thus making it difficult to form a linear structure. For this reason, if longer structures are required, or if inter-pad spacings greater than approximately 4 mm are provided, some variations of the method may mitigate these deleterious effects of the correspondingly high voltage requirements by performing the process with a voltage similar to that of the above described examples but beginning the structure forming process with the second electrode positioned between the first pad and the effective first electrode end position.

This is made possible by the use of a second electrode that is continuously movable with respect to the substrate or the first electrode. The forming of the structure may be started by positioning the second electrode between the effective first electrode end position, for example a second pad in contact with the first electrode, and the first pad, at a distance from the effective first electrode end position which would not require an excessive applied electric potential in order to safely and controllably cause dielectrophoretic structure assembly, for example 2 mm. As the structure begins to assemble from fluid-dispersed nanoparticles, the electrode can be moved along the distance between the effective first electrode end position and the second pad such that it is drawn away from the effective first electrode end position, at approximately the same speed as the rate in which the linear extent of the elongate structure is increasing during the assembly of the structure. This is typically around 50 µm per second. Thus, by drawing the second electrode along the path along which the elongate structure is to be formed at the appropriate rate while applying the appropriate alternating electric field, an elongate structure may be formed initially, without requiring excessively high applied voltages or a maximum limit upon inter-pad or first electrode-first pad spacings.

The printing or drawing of elongate structures of arbitrary length from assembled nanoparticles using DEP and a moving electrode is described, for example, at pages 42-43 of WO 2017/162696 A1.

In this way, the moving second electrode may be used to bring the growing end of a forming elongate structure within an appropriately small distance of the portion of the first pad towards which it is to be grown. Once an end of the elongate structure is within range of the destination pad portion, for example within 2 mm of it, the technique as described above in relation to the first and second example methods may be carried out. That is, once the effective first electrode end position has been brought sufficiently close to the first pad to allow the safe and controllable DEP assembly according to the first and second example methods, by virtue of the effective first electrode end position having been drawn towards the first pad portion by the moving second electrode, the second electrode may then be brought into contact with the first pad, thereby electrically activating the first pad and causing growth towards the first pad to continue.

It will be appreciated that the above-described variation, wherein relatively long elongate structures are grown by way of supplementing the structure formation achieved by way of the first or second example methods, wherein the second electrode is unmoving, with a structure assembly using movement of the second electrode, may be carried out in either direction along the distance illustrated in FIGS. 1 and 2. This may be accomplished by reversing the DC bias component of the applied alternating electric potential.

Figure 4:
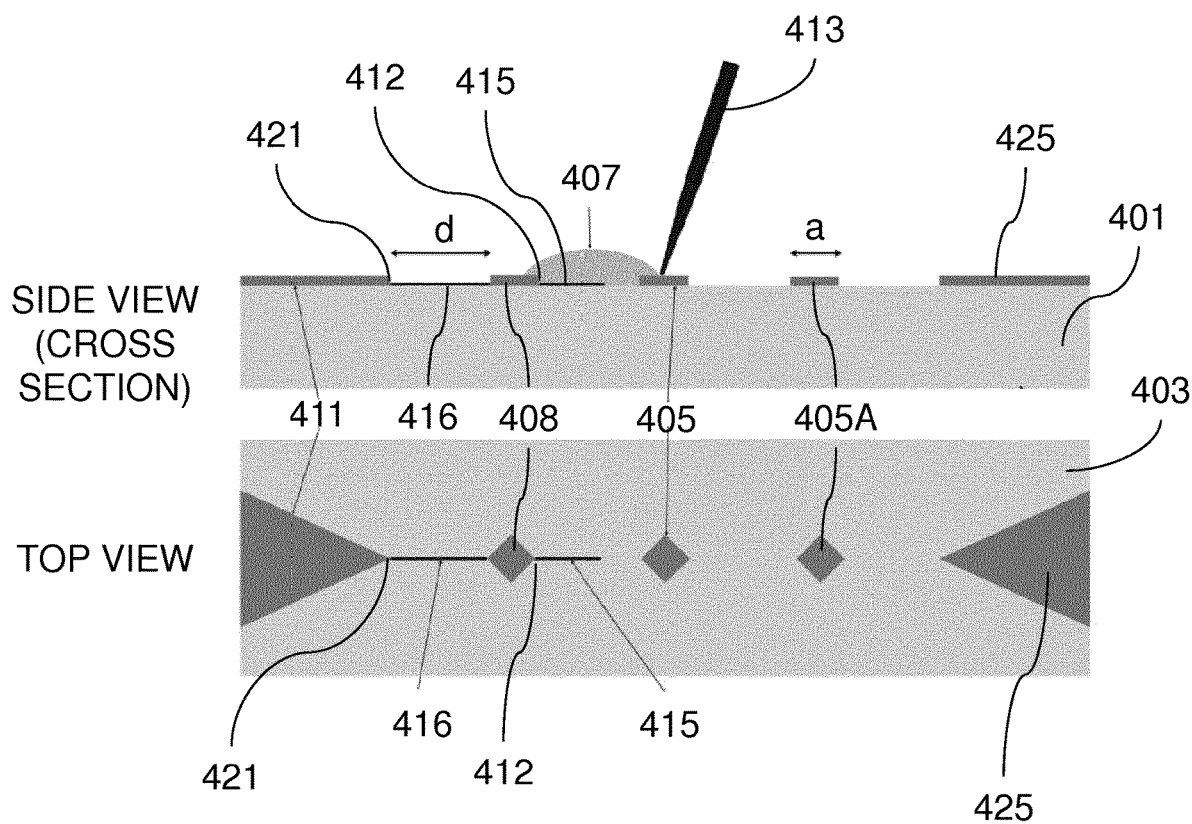
FIG. 4 is a schematic diagram showing a side view and a top view of an elongate structure being formed upon a substrate in accordance with a third example method according to the invention.

A third example method according to the invention is illustrated in FIG. 4. This shows a schematic diagram including a cross sectional side view of an elongate structure 415 during its formation. A top view of the same stage of the third example method is shown below the side view.

The present example method may be thought of as the continued formation of elongate structures upon a substrate comprising a plurality of the electrically conductive pads, following the forming of an elongate structure upon the substrate by a method similar to that of the first described example. Accordingly, as illustrated in FIG. 4, the substrate 401 comprises, at its surface 403, an elongate structure 416 that has already been formed, between the first electrode 411 and the conductive pad 408. The already-formed structure 416 has been grown between the aforementioned electrode and pad so as to connect them to one another electrically. The length of the structure thus corresponds to the distance d between the first electrode tip 421 and the corner of the pad 408 that is proximal thereto. In the present case, d is equal to 2 mm. Additionally, the substrate surface 403 has disposed upon it two further conductive pads 405, 405A. As is visible in the top view, the three pads 408, 405, 405A are arranged in a line. It can be seen that the first electrode has been positioned such that the tip 421 of that electrode is collinear with the line in which the pads are arranged. Each of the distances separating adjacent pads is equal to 2 mm.

Prior to the formation of the elongate structure 415, which is shown in a partially assembled state in FIG. 4, the effective first electrode end position 412 corresponds to a corner of the pad 408. This is because the previously formed elongate structure 416 and the pad 408 together act as a conductive member which extends the effective end position of the first electrode from the tip 421 of that electrode to the pad 408. Thus the electric field applied by the first electrode 411 is applied through the end of the conductive member at the position denoted by the numeral 412.

A volume of fluid 407 is deposited so as to at least partly cover each of the pads 408 and 405. Therefore the electrically polarizable nanoparticles (not shown) dispersed within the fluid 407 can be caused to assemble into an elongate structure between the pads 408 and 405.

To cause the formation of the elongate structure 415, the second electrode 413 is brought into contact with the pad 405, and an alternating electric potential is applied to the first 411 and second 413 electrodes, thereby causing the dispersed nanoparticles to be assembled via dielectrophoresis to form an elongate structure 415 extending from the corner 412 of the pad 408 towards the electrically activated pad 405.

Once the structure 415 has grown sufficiently long to contact the pad 405 towards which it is extending, the fluid 407 may be removed from the substrate. At such a stage, when the structure 415 has made electrical contact with the pad 405, said elongate structure 415 will itself form part of the conductive member attached to the first electrode 411, as well the pad 405. Thus the effective first electrode end position will have been moved so as to correspond to a corner of the pad 405. This means that the method may then be continued, so as to assemble a further elongate structure between the pads 405 and 405A.

To form such a further structure, a further volume fluid is deposited so as to contact each of the pads 405 and 405A, and the second electrode 413 is moved so as to be brought into contact with the pad 405A. The assembly process can then be repeated, with a new elongate structure growing between the new effective first electrode end position on the pad 405 towards the portion of the pad 405A that is in contact with the fluid.

Subsequent to the formation of said third elongate structure, a fourth elongate structure may be formed extending from the pad 405A, so as to further extend the line of alternating elongate structures and conductive pads. This may be performed by moving the second electrode 413 to a position within a volume of deposited fluid. However, in the present example, a third electrode 425 is provided, which applies an electric potential to cause a fourth elongate structure to be grown from the pad 405a towards the tip of the electrode 425.

By providing a substrate comprising conductive pads, and sequentially moving a second electrode 413 between them in the manner described above, it is possible to quickly and controllably create a compound structure of elongate structures and conductive pads with substantially any shape or configuration, depending upon the arrangement of the pads on the substrate and the process parameters used.

Figure 5:
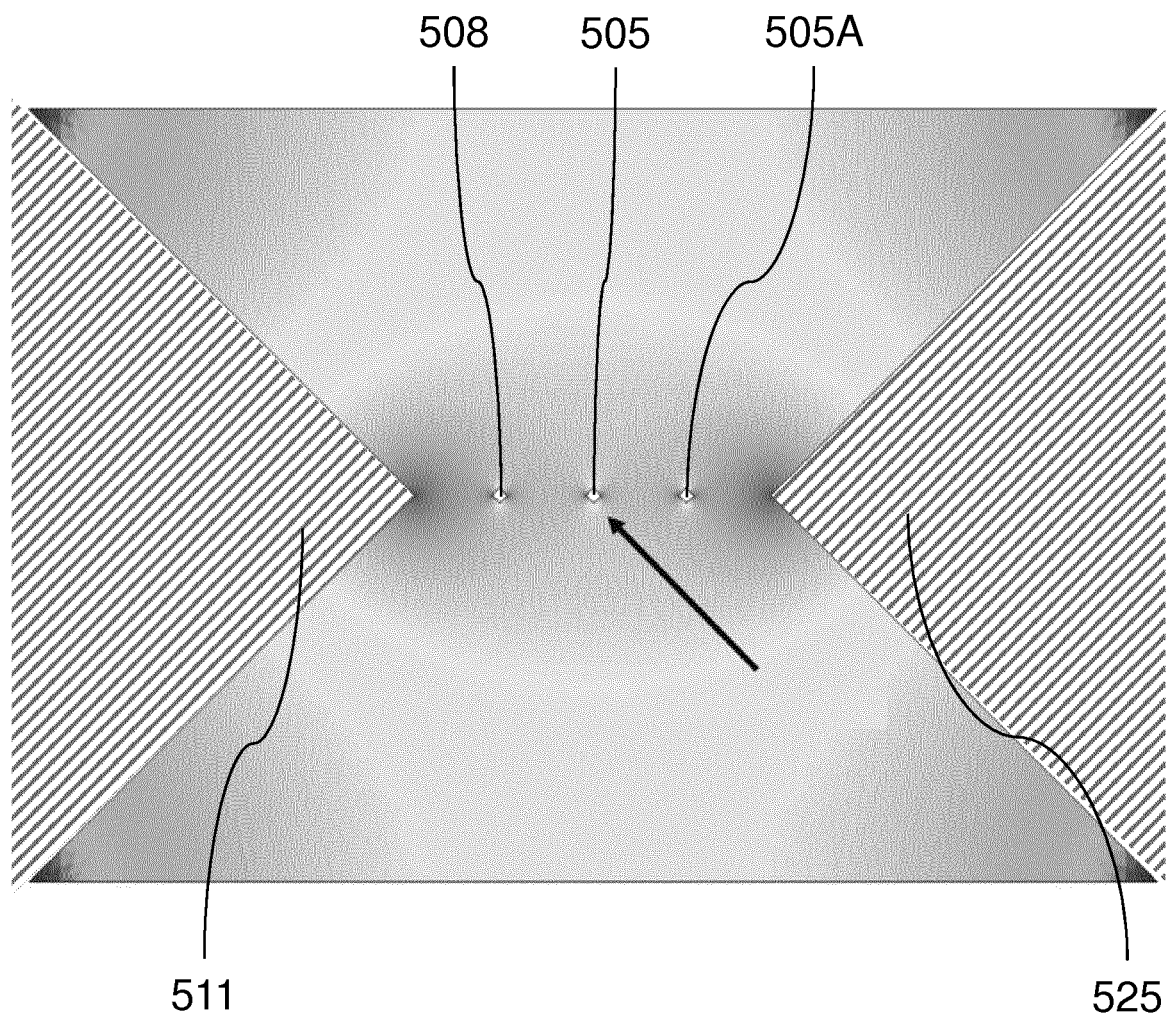
FIG. 5 is a graphical representation of an electric field distribution across a region of a substrate during the performing of the third example method according to the invention.

FIG. 5 shows a heat map illustrating the electric field distribution around the electrodes 411, 425 and conductive pads 408, 405, 405a prior to performing the third example method. In this diagram, darker red areas indicate areas of greater electric field strength. These calculated electric field values illustrate the influence of the presence of the conductive islands 508, 505, 505a arranged between the two electrodes 511, 525. From this illustration, it will be appreciated that the electric field, and therefore the DEP force fields, can be modulated by changing the position and shape of the conductive islands.

Although in the above-described examples, the conductive pads are square in shape, it is possible to provide and use in other example methods conductive pads having different or arbitrary shapes. Nonetheless, rectangular shapes provide a greater degree of control over the process owing to the regions of relatively high electric field intensity arising from the corners of pads that are so shaped.

Figure 6:
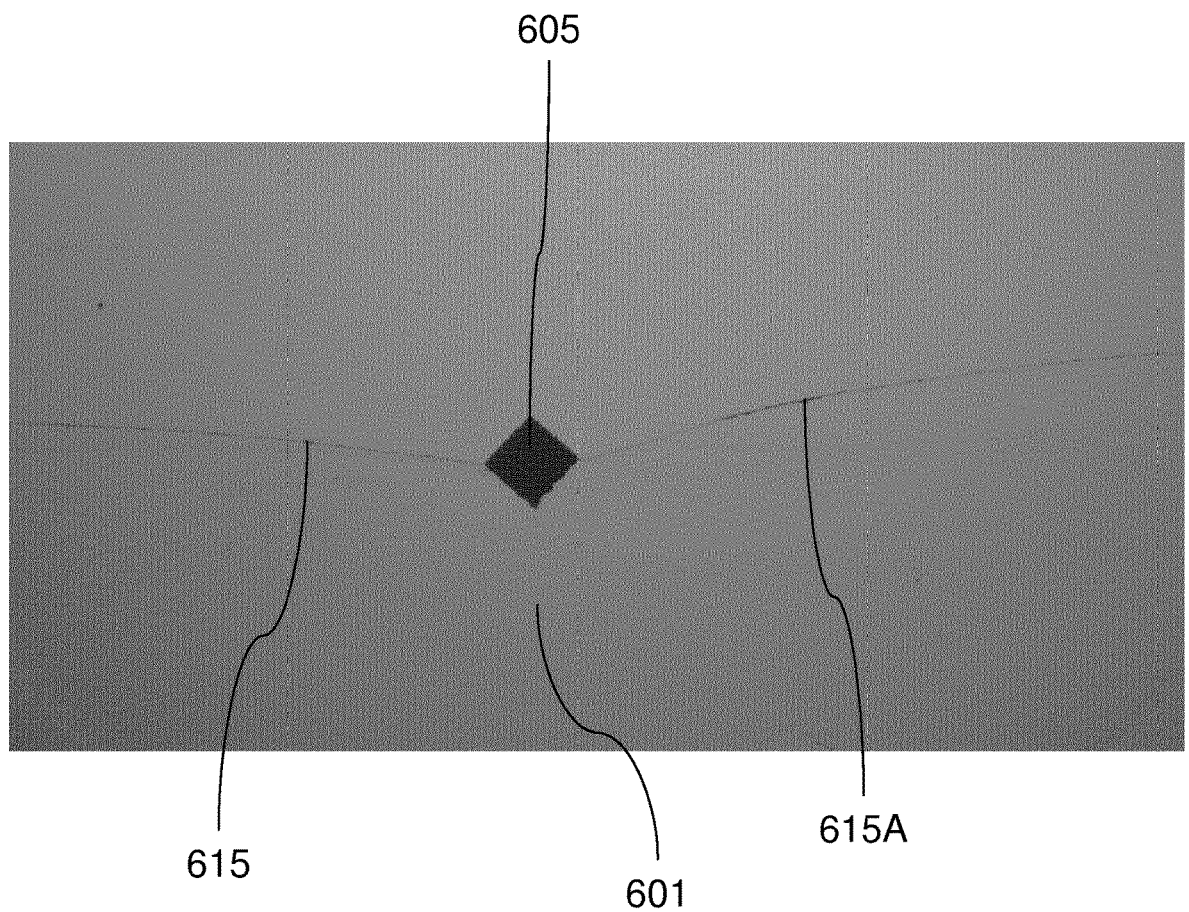
FIG. 6 is a microscopic image showing a part of a first example assembly according to the invention.

FIG. 6 shows part of a first example assembly according to the invention. The figure is a microscopic image showing a region of a substrate 601 from a top view. The substrate includes, disposed upon it, an electrically conductive pad 605 that is square in shape and has a side length of 100 μm. Also included on the substrate, but not shown in FIG. 6 owing to the scale of the image, are further pads disposed upon the surface. The pads, or islands, are arranged along a line and spaced apart with a spatial period of 2 mm. The line of pads comprises 11 pads, and is 2 cm in length.

The assembly includes elongate structures formed from silver nanoparticles and interconnecting adjacent pads, so as to form a 2 cm-long compound structure of elongate structures and pads. Two such elongate structures 615, 615A are visible in FIG. 6, each one joined to a corner of the central pad 605.

It will be appreciated that the creation of such an assembly, using methods such as those described above, are advantageous with regard to forming long elongate structures, in particular structures having lengths in the order of several centimetres or greater. For instance, forming an assembly comprising an elongate structure of equivalent length to that of the present example assembly but using techniques of the prior art would be slower and more difficult. The provision of conductive pads on the substrate and the sequential electrical activation of a series of those pads, using a movable second electrode for example, facilitates the rapid creation of a 2 cm-long conductive compound structure. While prior art techniques relying upon a moving second electrode to draw the growth of an elongate structure along the 2 cm path, for instance, would require continuous and precise movement of the second electrode along the path of the line to be assembled, the present example assembly may be produced relatively quickly by simply moving a second electrode through discrete movements between fixed positions corresponding to the pads to be included in the compound structure. This is simpler to achieve than continuous movement of the second electrode along the entire length of the path of structure growth, and also allows for faster structure assembly.

Figure 7:
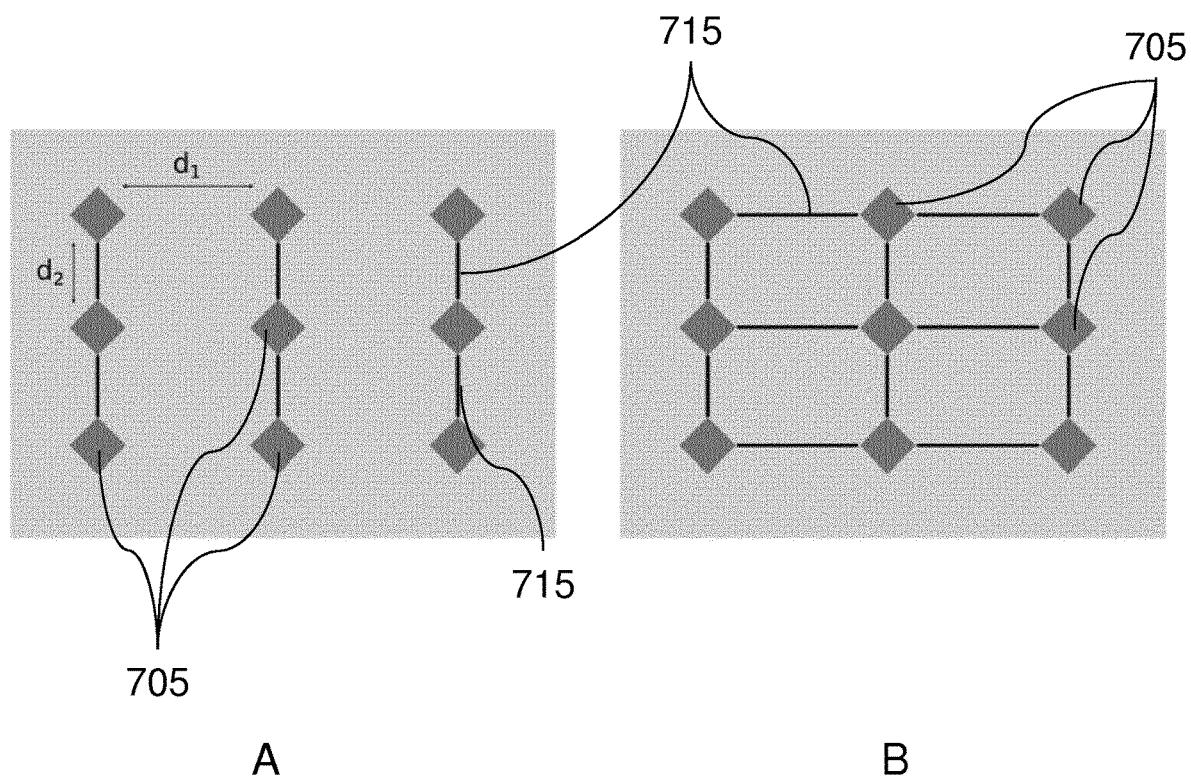
FIG. 7 is a schematic diagram showing a second example assembly according to the invention at two stages during its formation.

FIG. 7 shows a second example assembly according to the invention at two stages of production. The present example, in contrast with the previously described example assembly, which comprised a linear compound structure of elongate structures and conductive pads, comprises a conductive grid. This demonstrates a further advantage of the use of conductive pads or islands to guide nanoparticle assembly, which is the rapid and efficient creation of conductive grid structures upon a substrate. In such grids, the conductive islands 705 serve as intersections between assembled line structures 715, which interconnect adjacent pads 705 in the grid 719 and are oriented in different directions.

The second example assembly may be created using inter-pad elongate structure assembly in accordance with the above described example methods. First, as illustrated at A, a first set of lines 715 is created in a first orientation. Subsequently, as shown at B, a further set of elongate structures 715 is formed between the pads 705 in a second orientation, orthogonal to the first.

Although the distances $d_1$, $d_2$ between adjacent pads 705 in each of the two directions are, in the present example, uniform, the values of $d_1$ and $d_1$ can vary from, for example, 10 μm to 10 mm. In general, there is no requirement for these distances to be equal. As noted above, for greater inter-pad distances, it may be desirable to supplement the unmoving electrode or discrete electrode movement technique with some continuous movement of the second electrode so as to avoid excessively high applied voltages being required to bridge such distances with elongate structures.

Figure 8:
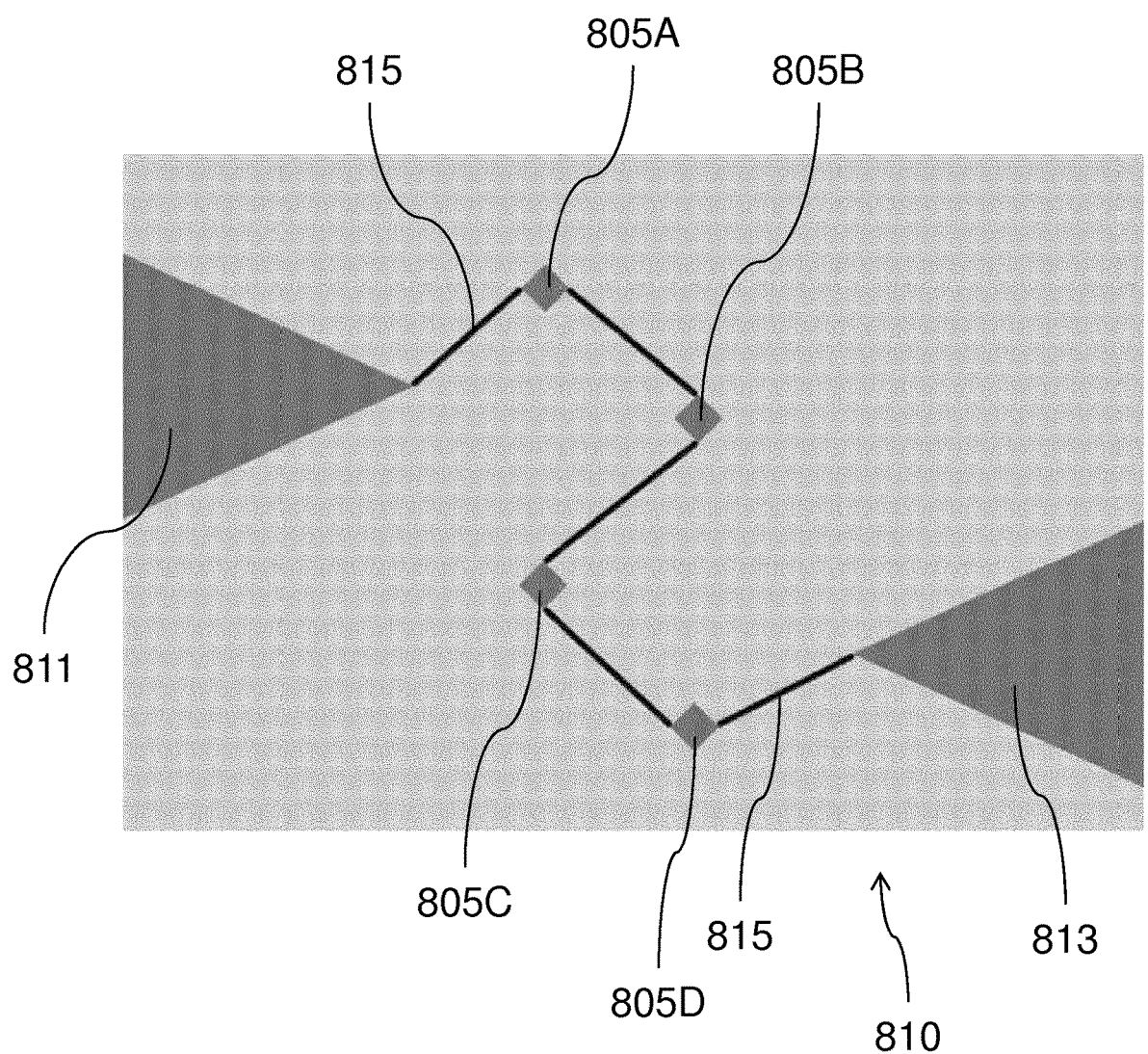
FIG. 8 is a schematic diagram showing a third example assembly according to the invention being formed.

A further possibility is the obtaining of arbitrary geometries of printed compound structures that deviate from the straight line compound structures illustrated hitherto. In this regard, the geometry of the printed structures may be determined by the position and shape of the conductive pads or islands 805, as shown in FIG. 8. FIG. 8 depicts a third example assembly according to the present invention being formed using a first electrode 811 and a second electrode 813. The figure shows the assembly 810 at the point of completion. The substrate 803 has disposed upon it four conductive pads 805 arranged in a non-linear pattern. Electrically polarizable nanoparticles have been assembled from a dispersion within a deposited fluid (not shown) to create five elongate structures 815 extending from opposite corners of the pads 805. The present example assembly may have been formed by keeping the first electrode 811 in position and sequentially moving the second electrode 813 so as to contact each of pads 805A, 805B, 805C, and 805D in order, and then positioning the second electrode 813 in its illustrated position, so as to form a final segment of elongate structure between the fourth pad 805D and the second electrode 813. It is also possible to form either of the elongate structure segments 815 in the opposite direction, by reversing the DC bias component of the applied electric field. For example, the final formed segment, between the fourth pad 805D and the second electrode 813 may be grown from the tip of the electrode 813 towards the pad 805D.

Any of the above described example methods, and the production of any of the above-described example assemblies may be performed using a print head for depositing the fluid onto the substrate. Examples of print heads configured to perform methods comprised by the state of the art are disclosed, for example, by WO 2017/162696 A1 at FIGS. 23-24 and pages 59-61.

To produce assemblies comprising conductive grids, such as the second example assembly described above, complex printing heads comprising several electrodes may be used. By providing printing heads with appropriately configured geometries, it is possible to fabricate multiple segments of a conductive grid in parallel, or simultaneously, in two orthogonal directions of lines on a grid. A fourth example method according to the invention, which employs a multi-electrode printing head is illustrated in FIG. 9.

Figure 9:
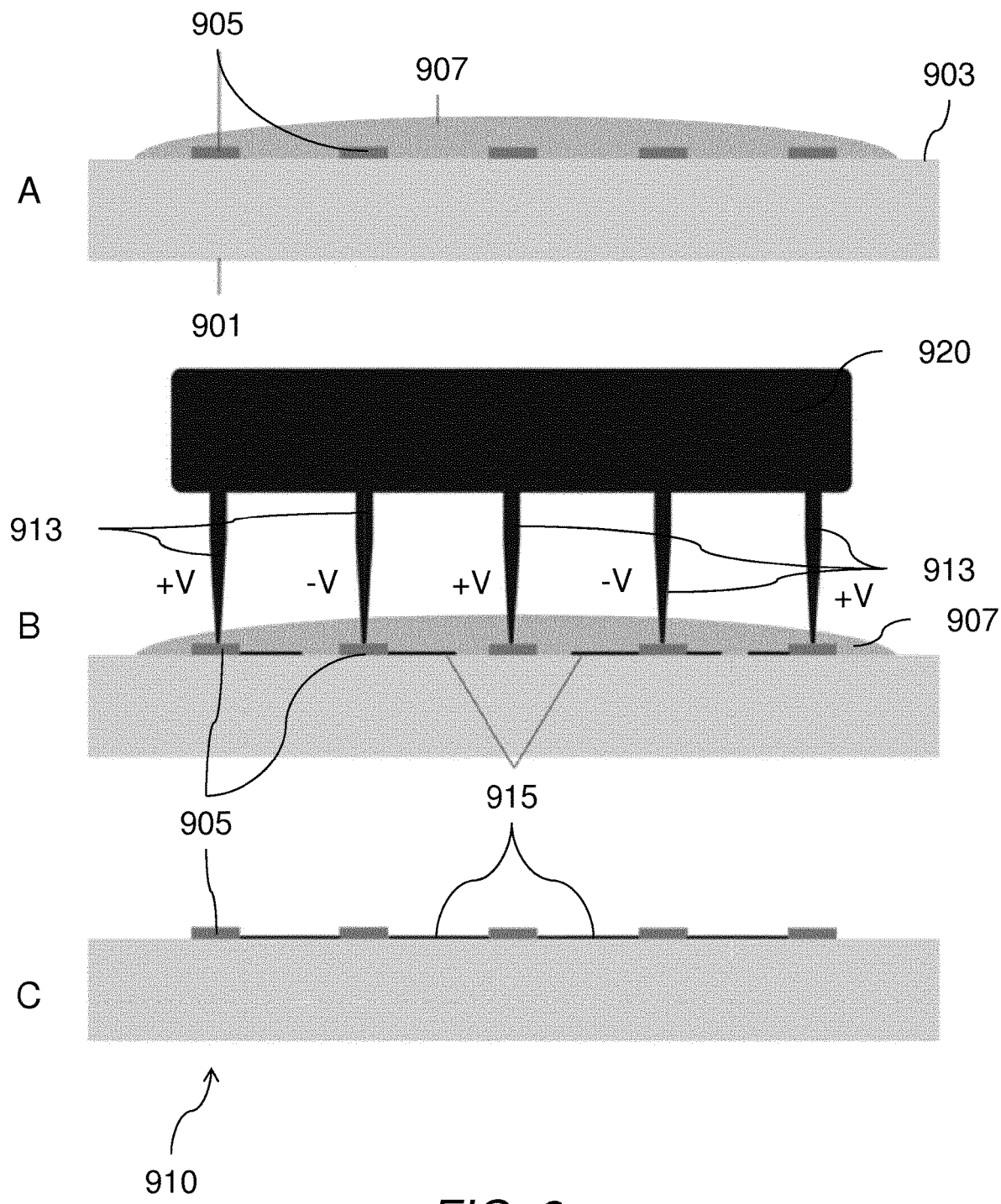
FIG. 9 is a schematic diagram showing a side view of three stages during the production of an assembly by way of a fourth example method according to the invention.

FIG. 9 shows, at A, B, and C a region of a substrate before, during, and after the fabrication of a multiple-elongate structure, multiple-conductive pad compound structure by way of the fourth example method, respectively. At stage A a substrate 901 comprising a plurality of conductive pads 905 on its surface 903 has deposited upon it a volume of fluid ink 907 which contains a dispersion of polarizable nanoparticles (not shown). The fluid 907 is deposited in a single volume defining a wetted region that covers all of the pads 905. At B a multi-electrode printing head 920 is introduced so as to bring the electrodes 913, of which the darker red areas indicate areas of higher printing head 920 comprises 5, into contact with the pads 905. The arrangement of the pads 905 upon the substrate surface 903 and the spatial configuration of the electrodes on the print head 913 correspond to one another. That is, the pattern in which the electrodes 913 are arranged or configured matches the pattern in which the pads 905 are distributed on the substrate surface such that each of the electrodes 913 may contact a respective pad 905 at a given time.

The present example illustrates a line of pads 905 and a print head including a corresponding line of electrodes 913. However, any pad arrangement and print head electrode geometry or arrangement is possible. For example, rather than a one dimensional array of electrodes and pads, that is a line, the substrate surface and the printing head 920 may in some alternatives be configured to include a two dimensional array, or grid of pads and electrodes. Thus a compound structure having a two dimensional grid pattern might be rapidly formed by bringing the appropriately configured printing head into contact with all of the pads simultaneously.

At B as depicted in FIG. 9, elongate structures 915 are being grown between pairs of adjacent pads 905 by way of dielectrophoretic nanoparticle assembly. The electric field for causing the dielectrophoretic action is applied to the fluid 907 by way of applying an alternating electric field to the fluid using the electrodes 913 such that adjacent electrodes have opposite plurality, with the +V and −V indicating positive and negative electric potential, respectively. In this way, a DEP-inducing electric field is produced across each of the distances between adjacent pads.

The completed assembly 910 is shown at C with the fluid having been removed.

Figure 10:
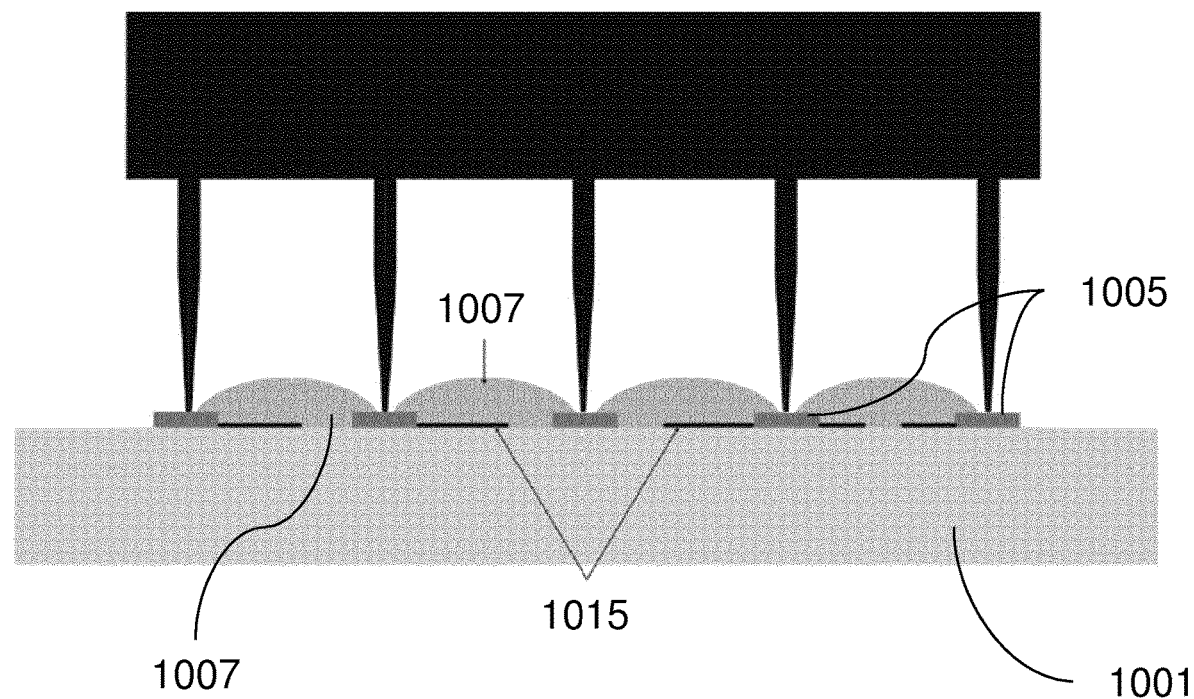
FIG. 10 is a schematic diagram showing a side view of an assembly being produced by a fifth example method according to the invention.

FIG. 10 shows a similar assembly being fabricated, by way of a fifth example method according to the invention. The present example method differs from the previous, fourth example method in that rather than a single volume of fluid 907 covering all of the pads, multiple volumes of fluid 1007 are deposited on the substrate 1001. Each volume of fluid 1007 is deposited so as to partially immerse each of a pair of adjacent pads 1005, without overlapping, joining, or merging with other of the multiple volumes of fluid 1007. Thus, it is possible to perform the fabrication of an assembly comprising a compound structure such as a line or grid using a multi-electrode print head both using a single stream of ink 907, which may simplify the fluid deposition process, and using a separate stream of ink 1007 between each pair of islands 1005. This fifth example method facilitates the production of a compound structure having multiple elongate structure components formed from multiple different materials. This could be achieved by providing different volumes of ink containing nanoparticles formed from different materials.

The invention claimed is:

1. A method of forming a structure upon a substrate, the method comprising:
  providing a substrate upon a surface of which a plurality of electrically conductive pads are disposed;
  depositing fluid containing a dispersion of electrically polarizable nanoparticles onto the substrate such that at least a portion of a first one of the plurality of pads is in contact with the fluid;
  applying an alternating electric field to the fluid using a first electrode and a second electrode, the first electrode being positioned so as to provide an effective first electrode end position from which the electric field is applied, coincident with the deposited fluid, and spaced apart from the first pad by a distance, and the second electrode being in contact with the first pad, such that a plurality of the nanoparticles are assembled by dielectrophoresis to form a first elongate structure extending along at least part of the distance between the effective first electrode end position and the portion of the first pad; and
  continuing to apply the electric field to the fluid at least until the first elongate structure connects the first pad and the effective first electrode end position,
  wherein the method further comprises:
  depositing fluid containing a dispersion of electrically polarizable nanoparticles onto the substrate such that at least a portion of a further one of the plurality of pads is in contact with the fluid; and
  applying an alternating electric field to the fluid using the first electrode positioned so as to provide a further effective first electrode end position from which the electric field is applied, coincident with the deposited fluid and spaced apart from the further pad by a distance and a second electrode in contact with the further pad, such that a plurality of the nanoparticles are assembled by dielectrophoresis to form a further elongate structure extending along at least part of the distance between the further effective electrode end position and the portion of the further pad,
  wherein the second electrode is movable with respect to the first electrode and the substrate, and the method comprises bringing the second electrode into contact with first pad so as to cause the first pad to act as a continuation of the second electrode, and
  wherein each of the plurality of pads occupies an area of the substrate surface having a shape comprising at least one corner.

2. A method according to claim 1, wherein the second electrode is movable with respect to the first electrode and the substrate, and wherein the second electrode being in contact with each pad during the applying of an electric field is caused by moving the second electrode with respect to the substrate so as to bring it into contact with each pad in succession.

3. A method according to claim 1, wherein, when applying the electric field to the fluid:
  the first electrode is in contact with the fluid such that the effective first electrode end position corresponds to an end part of the first electrode that is in contact with or immersed within the fluid, or
  the first electrode is in contact with a conductive member such that the effective first electrode end position corresponds to a part of the conductive member.

4. A method according to claim 1, wherein:
  when applying the electric field to the fluid the first electrode is in contact with the fluid such that the elongate structure extends from the first electrode towards the portion of the first pad; or
  the one or more pads comprise a second pad, at least of portion of which is in contact with the fluid, and when applying the electric field to the fluid the first electrode is in contact with the second pad such that the elongate structure extends from the portion of the second pad towards the portion of the first pad.

5. A method according to claim 1, wherein the fluid deposited so as to contact the portion of the further pad and the fluid deposited so as to contact the portion of the first pad comprise different materials.

6. A method according to claim 1, wherein the electrode that contacts the further pad is a third electrode.

7. A method according to claim 1, wherein the electrode that is positioned so as to provide a further effective electrode end position is a fourth electrode, so that the further effective electrode end position is an effective fourth electrode end position.

8. A method according to claim 6, wherein the time during which the electric field is applied so as to form the first elongate structure overlaps at least partly with the time during which the electric field is applied so as to form the further elongate structure.

9. A method according to claim 1, wherein the fluid with which the portion of the further pad is in contact is positioned so as to contact a conductive member that is electrically connected to the first electrode.

10. A method according to claim 9, wherein the conductive member forms part of the first pad or forms part of another of the plurality of pads.

11. A method according to claim 1, and further comprising, for each of one or more additional ones of the plurality of pads:
  depositing fluid containing a dispersion of electrically polarizable nanoparticles onto the substrate such that at least a portion of the respective additional pad is in contact with the fluid, applying an alternating electric field to the fluid;
  applying an alternating electric field to the fluid using an electrode positioned so as to provide an additional further effective electrode end position coincident with the deposited fluid and spaced apart from the respective additional pad by a distance and another electrode in contact with the respective additional pad, such that a plurality of the nanoparticles are assembled to form a respective additional elongate structure extending along at least part of the distance between the additional further effective electrode end position and the portion of the respective additional pad.

12. A method according to claim 1, wherein each of the plurality of conductive pads is affixed to the surface of the substrate.

13. A method according to claim 1, further comprising, before applying an alternating electric field to the fluid with the second electrode in contact with the first pad so as to form the elongate structure:

applying an alternating electric field to the fluid using the first electrode and the second electrode, with the second electrode positioned between the effective first electrode end position and the first pad, so that a plurality of the nanoparticles are assembled to form an initial elongate structure extending from the effective first electrode end position towards the second electrode, and increasing the separation between the effective first electrode end position and the second electrode by moving the second electrode towards the first pad so as to further extend the initial elongate structure towards the first pad, wherein, when an alternating electric field is applied to the fluid with the second electrode in contact with the first pad, the end of the elongate structure that is proximal to the second electrode corresponds to the end of the initial elongate structure, such that the elongate structure is formed as an extension of the initial elongate structure.

14. A method according to claim 1, comprising forming a plurality of elongate structures connected to each of the plurality of pads.

15. A method according to claim 14, wherein four or more of the electrically conductive pads are disposed in a regular array pattern upon the surface of the substrate, and wherein the method comprises forming a plurality of elongate structures interconnecting the pads in the array such that a plurality of the interconnecting elongate structures are connected to each of at least one of the pads in the array.

16. A method according to claim 1, wherein each of plurality of pads is formed from a metal material.

17. A method according to claim 1, comprising providing an assembly comprising a substrate having a plurality of electrically conductive pads disposed on a surface thereof, wherein each of the plurality of pads is electrically connected to one or more elongate structures formed upon the surface of the substrate and having a width less than 10 μm, wherein the plurality of pads are interconnected by the one or more elongate structures.

18. The method according to claim 17, wherein at least one of the one or more elongate structures has a length greater than 10 μm.

19. The method according to claim 18, wherein at least one of the one or more elongate structures has a length greater than 4 mm.

* * * * *